(12) United States Patent
Beppu et al.

(10) Patent No.: US 9,666,774 B2
(45) Date of Patent: May 30, 2017

(54) LIGHT EMITTING DEVICE AND METHOD FOR PRODUCING THE SAME

(71) Applicant: Nichia Corporation, Anan-shi, Tokushima (JP)

(72) Inventors: Suguru Beppu, Anan (JP); Yoichi Bando, Anan (JP); Hiroto Tamaki, Anan (JP); Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/866,317

(22) Filed: Sep. 25, 2015

(65) Prior Publication Data

US 2016/0093780 A1    Mar. 31, 2016

(30) Foreign Application Priority Data

Sep. 26, 2014  (JP) ................. 2014-197340

(51) Int. Cl.
*H01L 33/60* (2010.01)
*H01L 33/50* (2010.01)

(52) U.S. Cl.
CPC .............. *H01L 33/60* (2013.01); *H01L 33/50* (2013.01); *H01L 2933/0033* (2013.01)

(58) Field of Classification Search
CPC ...................................................... H01L 33/60
See application file for complete search history.

(56) References Cited

U.S. PATENT DOCUMENTS

| | | | | |
|---|---|---|---|---|
| 2008/0042151 A1* | 2/2008 | Oh | ....... | H01L 25/0753 257/88 |
| 2009/0212315 A1* | 8/2009 | Sakamoto | ....... | H01L 33/60 257/98 |
| 2009/0296367 A1* | 12/2009 | Sekine | ....... | H01L 33/60 362/84 |
| 2010/0320479 A1* | 12/2010 | Minato | ....... | H01L 33/56 257/88 |
| 2012/0162984 A1* | 6/2012 | Fujimori | ....... | H01L 33/60 362/235 |
| 2014/0087498 A1* | 3/2014 | Terayama | ....... | H01L 33/0095 438/26 |
| 2014/0175489 A1* | 6/2014 | Hodota | ....... | H01L 33/38 257/98 |

(Continued)

FOREIGN PATENT DOCUMENTS

| | | |
|---|---|---|
| JP | 2010-047773 A | 3/2010 |
| JP | 2010-157638 A | 7/2010 |

(Continued)

*Primary Examiner* — Allan R Wilson
(74) *Attorney, Agent, or Firm* — Foley & Lardner LLP

(57) ABSTRACT

A light emitting device includes a semiconductor light emitting element; and a light reflective member having a multilayer structure and covering the side faces of the semiconductor light emitting element. The light reflective member includes: a first layer disposed on an inner, semiconductor light emitting element side, the first layer comprising a light-transmissive resin containing a light reflective substance, and a second layer disposed in contact with an outer side of the first layer, the second layer comprising a light-transmissive resin containing the light reflective substance at a lower content than that of the first layer.

28 Claims, 21 Drawing Sheets

(56) References Cited

U.S. PATENT DOCUMENTS

2015/0188004 A1* 7/2015 Ozeki ................... H01L 33/507
                                                              257/98
2016/0118558 A1* 4/2016 Abe ........................ H01L 33/60
                                                              257/98

FOREIGN PATENT DOCUMENTS

| JP | 2010-192629 A |   | 9/2010 |
| JP | 2010248484 A | * | 11/2010 |
| JP | 2012-156443 A |   | 8/2012 |
| JP | 2012-243822 A |   | 10/2012 |
| JP | 2014-067876 A |   | 4/2014 |

* cited by examiner

LIGHT EMITTING DEVICE AND METHOD FOR PRODUCING THE SAME

CROSS-REFERENCE TO RELATED APPLICATION

This application claims priority to Japanese Patent Application No. 2014-197340, filed on Sep. 26, 2014. The entire disclosure of Japanese Patent Application No. 2014-197340 is hereby incorporated herein by reference.

BACKGROUND OF THE INVENTION

1. Field of the Invention

The present disclosure relates to a light emitting device having a semiconductor light emitting element and a light reflective member, and a method of producing the same.

2. Description of Related Art

Light emitting devices provided with a reflective layer on the side faces of an LED (light emitting diode), which is a semiconductor light emitting element, for efficient upward emission have been proposed. For example, Japanese Unexamined Patent Application Publication No. 2012-243822 ("JP '822") discloses a light emitting device in which the side faces of the LED chip are covered with a resin member to which reflectance is imparted by including a light reflective filler in a light-transmissive resin.

Japanese Patent Publication No. 4778085 ("JP '085") discloses a light emitting device in which a package is formed with a resin material that contains at least 46 wt % of a light reflective filler, and an LED is mounted in the recess of the package.

In cases where a reflective layer is formed with a white resin to which reflectance is imparted by having the light-transmissive resin contain a light reflective filler, as in the light emitting device disclosed in JP '822, a portion of the light incident on the reflective layer occasionally passes through and leaks out.

In order to achieve an adequate reflectance using a white resin, moreover, a light reflective filler must be added at a high content, as in the case, for example, of the resin material disclosed in JP '085. Adding a light reflective filler at a high content, however, reduces the fluidity of the resin material, making it hard, and results in reduced formability. This also makes the molding brittle, thereby reducing its reliability.

For these reasons, it was difficult to form a reflective layer (i.e. light reflective member) that had both good reflectance and high reliability on the side faces of a semiconductor light emitting element using a resin material.

SUMMARY OF THE INVENTION

Embodiments of the present invention have been developed in view of the above-mentioned problems, and it is an object of certain embodiments of the invention to provide a light emitting device having a light reflective member that has both good reflectance and high reliability using a material made of a resin and a light reflective substance, and to provide a method of producing the same.

A light emitting device according to one embodiment of the present invention includes a semiconductor light emitting element and a multi-layered light reflective member that covers side faces of the semiconductor light emitting element. The light reflective member includes a first layer, which is disposed on the inner side, the semiconductor light emitting element side, and made of a light-transmissive resin containing a light reflective substance, and a second layer, which is disposed in contact with the outer side of the first layer, and made of a light-transmissive resin having a lower content of the light reflective substance than that of the first layer.

A light emitting device production method according to one embodiment of the invention is a production method for a light emitting device in which the side faces of the semiconductor light emitting element are covered by a multilayer-structured light reflective member, and has a semiconductor light emitting element mounting step to mount the semiconductor light emitting element on a substrate; a first layer forming step to form a first layer of the light reflective member made of a light-transmissive resin containing a light reflective substance so as to cover the upper and side faces of the semiconductor light emitting element; a second layer forming step to form a second layer of the light reflective member made of a light-transmissive resin containing the light reflective substance at a lower content than the first layer on the first layer; and a light reflective member removing step to remove the first layer and the second layer formed on the upper face of the semiconductor light emitting element.

A light emitting device production method according to another embodiment of the invention is a production method for a light emitting device in which the side faces of the semiconductor light emitting element are covered by a light reflective member having a multilayer structure, and has a semiconductor light emitting element mounting step to mount the semiconductor light emitting element on a sheet having an adhesive surface so that the sheet and the light extraction face of the semiconductor light emitting element oppose one another; a light-transmissive member forming step to form a light-transmissive member disposed in contact with the side faces of the semiconductor light emitting element and having an outer face sloping outwardly in the light extracting direction with respect to the thickness of the semiconductor light emitting element; a first layer forming step to form a first layer of the light reflective member made of a light-transmissive resin containing a light reflective substance so as to cover the upper face of the semiconductor light emitting element and the outer face of the light-transmissive member; a second layer forming step to form a second layer of the light reflective member made of a light-transmissive resin having a lower content of the light reflective substance than the first layer on said first layer; a light reflective member removing step to expose the electrodes of the semiconductor light emitting element by removing the first and second layers formed on the upper face of the semiconductor light emitting element; and a sheet removing step to remove the sheet by detaching from the semiconductor light emitting element and the light-transmissive member.

The light emitting devices according to certain embodiments of the invention can increase not only frontal luminance, but also the reliability of the light emitting device.

The light emitting device production method according to certain embodiments of the invention can produce a light emitting device having both high frontal luminance and high reliability.

DETAILED DESCRIPTION

Figure 1:
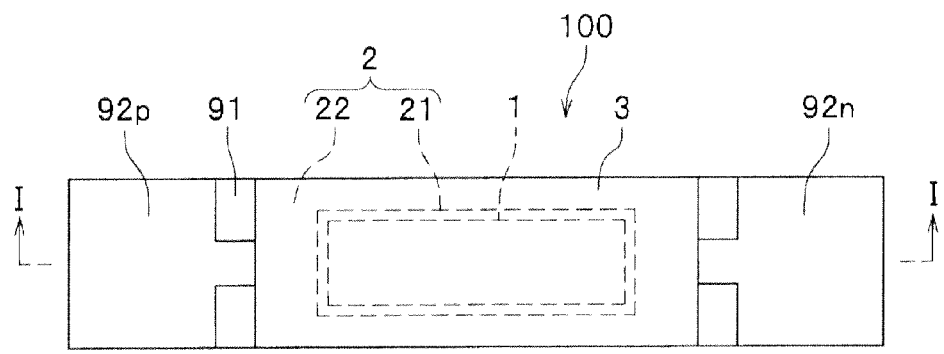
FIGS. 1(a) and (b) are schematic views showing a light emitting device according to a first embodiment of the invention where (a) is a plan view, and (b) is a sectional view at line I-I in (a).
Figure 1:
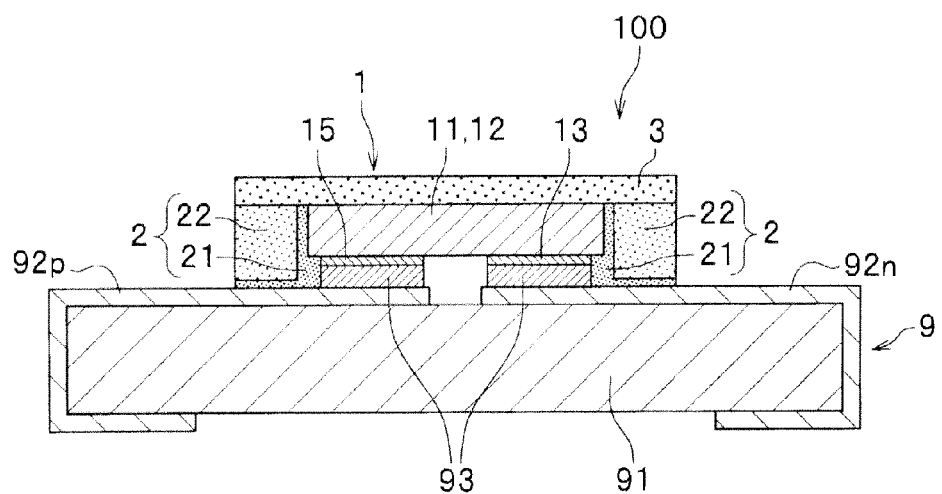

The light emitting devices and the production method according to embodiments of the invention, will be explained below.

The drawings referenced in the explanation below are schematic representations of the embodiments of the invention. As such, the members might not be drawn to scale, the spacing and their relative positions may be exaggerated, or a part of a member might be omitted.

Moreover, the scale or spacing of the members might not match between the plan and sectional views. Also, in the explanation below, elements having the same designations and reference numerals are basically of the same material, for which detailed explanations are omitted whenever appropriate.

First Embodiment

Light Emitting Device Configuration

First, the configuration of the light emitting device according to a first embodiment of the present invention will be explained with reference to FIGS. 1 and 2.

As shown in FIG. 1, the light emitting device 100 of this embodiment has a semiconductor light emitting element 1 (hereinafter referred to as "light emitting element" when appropriate), a light reflective member 2, a wavelength conversion member 3, and a mounting substrate (submount) 9.

The light emitting element 1 is flip-chip mounted on a mounting substrate 9 via a conductive adhesive material 93, such as solder.

On the side faces of the light emitting element 1, a light reflective member 2 having a first layer 21 and second layer 22 is provided to increase the light extraction efficiency from the upper face of the light emitting element 1.

On the upper face of the light emitting element 1, moreover, a wavelength conversion member 3 is provided to allow at least a portion of the light emitted from the light emitting element 1 to exit after being converted into light of a different wavelength.

Each element of the light emitting device 100 will be sequentially explained in detail subsequently.

The light emitting element 1 is an LED chip suitably configured for flip chip mounting, which has roughly a rectangular parallelepiped shape (an oblong rectangle in a plan view), and is provided with an n-side electrode 13 and p-side electrode 15 on one face to be connected to the wiring electrodes 92n and 92p of the mounting substrate (submount) 9 via a conductive adhesive material 93.

Now, an example of the configuration of the light emitting element 1 will be explained with reference to FIG. 2. In FIG. 2, the chip is oriented to have the face having the n-side electrode 13 and p-side electrode 15 on the upper side, what is shown in FIG. 1(b) is turned upside down. In FIG. 1, the later discussed FIG. 6, or the like, moreover, the illustration of the configuration of the light emitting element 1 is simplified.

Figure 2:
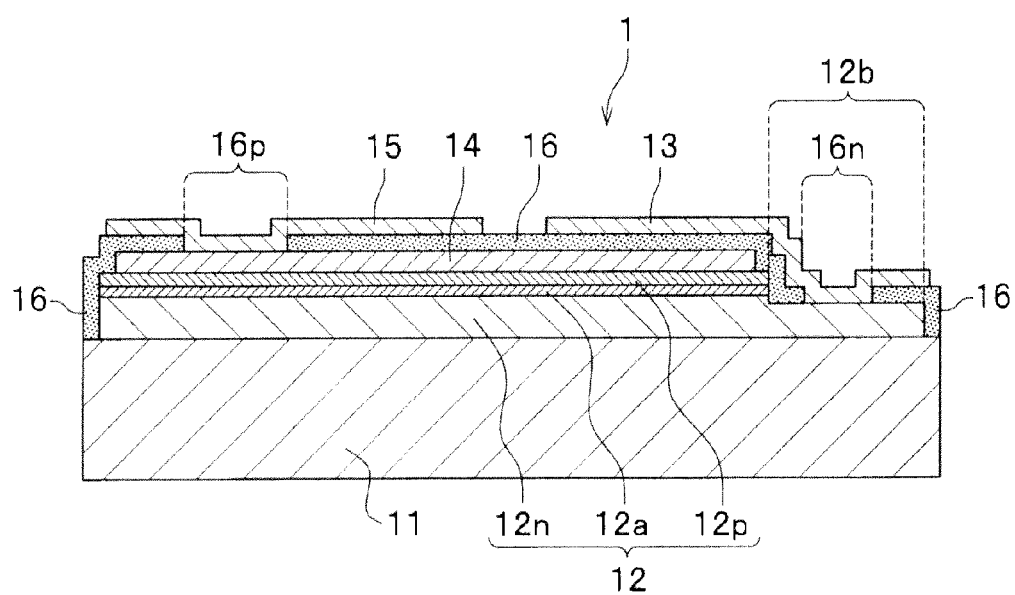
FIG. 2 is a schematic sectional view showing an example of a semiconductor light emitting element configuration employed in the light emitting device according to the first embodiment of the invention.

As shown in FIG. 2, the light emitting element 1 has a growth substrate 11, semiconductor stack 12, n-side electrode 13, full surface electrode 14, p-side electrode 15, and insulator 16.

The light emitting element 1 has a semiconductor stack 12 in which an n-type semiconductor layer 12n and p-type semiconductor layer 12p are stacked on one face of the growth substrate 11. The semiconductor stack 12 is adapted to emit light when current flows between the n-side electrode 13 and p-side electrode 15 by connecting to an external power supply, and is preferably provided with an active layer 12a between the n-type semiconductor layer 12n and p-type semiconductor layer 12p.

The growth substrate 11 is provided to allow the semiconductor stack 12 to be epitaxially grown. The growth substrate 11 can be formed with any substrate material capable of allowing for the epitaxial growth of the semiconductor stack 12, and its size or thickness is not particularly limited. In cases where the semiconductor stack 12 is formed using a nitride semiconductor such as GaN (gallium nitride), for example, these substrate materials include an insulating substrate, such as c-plane, r-plane, or a-plane sapphire, and spinel ($MgAl_2O_4$), as well as silicon carbide (SiC), ZnS, ZnO, Si, GaAs, diamond, and an oxide substrate, such as lithium niobate, neodymium gallate, and the like, that form a lattice junction with a nitride semiconductor. It is preferable to use a material having good light transmissive property for the growth substrate 11 to configure the light emitting element 1 suitable for flip chip mounting.

In the semiconductor stack 12, an n-type semiconductor layer 12n which includes an active layer 12a, and p-type semiconductor layer 12p are stacked. The semiconductor stack 12 is provided with a region where both the p-type semiconductor layer 12p and the active layer 12a are partially absent, that is, a region recessed from the surface of the p-type semiconductor layer 12p (this region is referred to as the "stepped section 12b"). At the bottom face of the stepped section 12b, an n-side electrode 13 which is electrically connected to the n-type semiconductor layer 12n is provided. A full surface electrode 14 having good electrical conductivity and light reflectance is provided substantially across the entire upper surface of the p-type semiconductor layer 12p. The surface of the semiconductor stack 12 is covered with an insulator 16 directly or via the full surface electrode 14, except for a portion of the bottom of the stepped section 12b and a portion of the upper face of the full surface electrode 14.

For the semiconductor stack 12 (n-type semiconductor layer 12n, active layer 12a, and p-type semiconductor layer 12p), $In_XAl_YGa_{1-X-Y}N$ ($0 \leq X$, $0 \leq Y$, $X+Y<1$), or the like, is suitably used. These semiconductor layers, moreover, may individually have a single layer structure, a multilayer structure having layers of different compositions and film thicknesses, or a superlattice structure. The active layer 12a, in particular, preferably has a single quantum well or multi-quantum well structure where thin films are stacked that generates quantum effects.

The full surface electrode 14 is provided to substantially cover the entire upper face of the p-type semiconductor layer 12p. The full surface electrode 14 is a conductive layer for diffusing the current supplied via the p-side electrode 15, which is disposed in one portion of the upper face, across the entire surface of the p-type semiconductor layer 12 p. The full surface electrode 14, moreover, has good reflectance to also function as a reflective film to reflect the light emitted by the light emitting element 1 downwardly (in FIG. 1(b), upwardly) towards the light extraction face.

For the full surface electrode 14, a metal material having good conductivity and reflectivity can be used. As a metal material having good reflectivity particularly in the visible light range, Ag, Al, or an alloy having these metals as main components can be suitably used. For the full surface electrode 14, moreover, these metal materials in a single layer, or multiple layers, can be used. When Ag which is prone to migration is used as the lower layer of the full surface electrode 14 (on the p-type semiconductor layer 12p side), it is preferable to cover the lower layer with an upper layer made of a metal material having good conductivity and barrier properties, such as Al, Ti, W, Au, or the like.

The n-side electrode 13 is provided to be electrically connected to the n-type semiconductor layer 12n within the opening 16n of the insulator 16 at the bottom face of the stepped section 12b of the semiconductor stack 12. The p-side electrode 15 is provided to be electrically connected to the full surface electrode 14 within the opening 16p of the insulator 16 on the upper face of the full surface electrode 14. The n-side electrode 13 and p-side electrode 15 are pad electrodes to supply the current from the outside to the n-type semiconductor layer 12n and p-type semiconductor layer 12p via the full surface electrode 14, respectively.

The n-side electrode 13 and p-side electrode 15 are provided in the extended areas of the full surface electrode 14 via the insulator 16.

For the n-side electrode 13 and p-side electrode 15, a metal material can be used, and for example, a single metal, such as Ag, Al, Ni, Rh, Au, Cu, Ti, Pt, Pd, Mo, Cr, W, or the like, and their alloys can be suitably used. For the n-side electrode 13 and p-side electrode 15, moreover, a single layer or multiple layers of these metal materials can be used.

The insulator 16 covers the upper and side faces of the semiconductor stack 12 and full surface electrode 14, and functions as a protective and antistatic film of the light emitting element 1. The insulator 16 has an opening 16n in one portion of the bottom face of the stepped section 12b, and an opening 16p in one portion of the upper face of the full surface electrode 14. In the large area of the upper face of the insulator 16, n-side electrode 13 and p-side electrode 15 are provided so as to extend complementarily to one another.

For the insulator 16, a metal oxide or metal nitride can be used.

For example, at least one metal oxide or metal nitride selected from the group consisting of Si, Ti, Zr, Nb, Ta, and Al can be suitably used.

The light emitting element 1 shown in FIG. 2 is one example; the outer shape, and the regions where the stepped section 12b, n-side electrode 13, p-side electrode 15, and the like are provided can be suitably modified.

Referring back to FIG. 1, the explanation of the configuration of the light emitting device 100 will be continued.

The light reflective member 2 is provided to cover the side faces of the light emitting element 1, and to reflect the light exiting from the side faces of the light emitting element 1 into the light emitting element 1. Here, the light reflective member 2 is provided on the side faces of the semiconductor stack 12 and growth substrate 11, which are the members in which the light propagates. This can increase the emission luminance at the upper face of the light emitting element 1, which is the light extraction face.

The light reflective member 2 shown in FIG. 1 have a first layer 21 provided on the inner side, that is, the light emitting element 1 side, and a second layer 22 provided on the outer side of the first layer 21.

The first layer 21 and second layer 22 are formed by having a light-transmissive resin contain particles of a light reflective substance.

As previously discussed, as the light reflective substance content increases, the reflectance increases, but the resin becomes hard due to the decrease of the fluidity of the resin material, resulting in reduced formability. This also makes the molding brittle, thereby reducing its reliability. In this embodiment, therefore, the first layer 21 is formed with a high light reflective substance content to achieve higher reflectance than the second layer 22, and in a smaller thickness than the second layer 22 so that the light reflective member 2 does not become brittle as a whole. At the same time, the second layer 22 is provided with a light reflective substance content in the range capable of achieving adequate formability, and is formed as a thick film to secure the mechanical strength of the light reflective member 2 as a whole. Both reflectance and formability can be successfully achieved by configuring the light reflective member 2 in this manner. By having such a light reflective member 2, the light emitting device 100 can increase both its frontal (extracting direction) emission luminance and reliability.

The light reflective substance content of the first layer 21 can be determined in accordance with its thickness. The first layer 21 is reinforced by the second layer 22 from the outer side so as to maintain its shape. Thus, the first layer 21 can have the light reflective substance at a higher content than the second layer 22 to achieve higher reflectance than the second layer 22.

For good reflectance, the light reflective substance content of the first layer 21 is preferably set to at least 60 mass %, more preferably at least 90 mass %. Moreover, the light reflective substance content of the first layer 21 is preferably set to 99 mass % at most to allow the light reflective substance particles to be adequately bound together.

However, the light reflective substance content of the first layer 21 may exceed 99 mass %, as long as adequate adhesion is achieved between the first layer 21 and the side surfaces of the light emitting element 1.

In order to form the first layer 21 into a stable shape and at a stable thickness accuracy, it is preferable to set the thickness to at least 2 μm, more preferably at least 10 μm.

Moreover, it is preferable to form the first layer 21 as a thick film to the extent that the shape can be maintained with the reinforcement provided by the second layer 22. For this purpose, the thickness of the first layer 21 is preferably 30 μm at most.

It is preferable for the second layer 22 to have a high content of the light reflective substance to the extent that it achieves adequate formability using a forming method involving a mold, frame, or the like.

The light reflective substance content of the second layer 22 is preferably set to at least 10 mass %, but 60 mass % at most, more preferably at least 20 mass %, but 50 mass % at most.

However, in cases where the first layer 21 can be formed with adequately high reflectance (for example, 90% or more), the light reflective substance content of the second layer 22 may be set to about 1 mass %, or none.

The second layer 22, moreover, is preferably formed in the thickness capable of adequately reinforcing the first layer 21 to maintain the shape of the first layer 21. For this purpose, the thickness of the second layer 22 is preferably set to at least 30 μm.

It is preferable for the resin material used for the first layer 21 to have a good light transmissive property. It is also preferable to use a thermosetting resin for the resin material. Preparing a slurry of a solvent, thermosetting resin, and solid particles of light reflective substance, and curing the thermosetting resin by heating after spray coating, can form a first layer 21 to a thickness in a stable manner even at a high content of the solid particles of the light reflective substance.

Such a resin material includes, for example, silicone resin, silicone modified resin, epoxy resin, epoxy modified resin, urea resin, phenolic resin, polycarbonate resin, acrylic resin, polymethylpentene resin, polynorbomene resin, or a hybrid resin which contains one or more of these resins. Among all, a silicone resin or epoxy resin is preferable, and silicone resin which has good light resistance and heat resistance is particularly more preferable.

For the second layer 22, any of the resin materials described for the first layer 21 can be used. The second layer 22, as in the case of the first layer 21, can be formed by not only spraying, but also molding, screen printing, or the like.

Although different resin materials can be used for the first layer 21 and second layer 22, employing the same material for both can increase the adherence between the first layer 21 and second layer 22.

Moreover, when forming the second layer 22, silica, or the like, may be added to the slurry discussed above for the purpose of adjusting its viscosity and fluidity.

Moreover, the resin used for the first layer 21 preferably has a higher refractive index against the light emitted by the light emitting element 1 than that of the resin used for the second layer 22.

This allows for the light that passes through the first layer 21 and propagates towards the second layer 22 to be efficiently reflected at the interface between the first layer 21 and second layer 22 based on Snell's law.

For the light reflective substances to be contained in the first layer 21 and second layer 22, it is preferable to use particles of a material having a refractive index significantly different from that of the resin materials described above, as well as having good transmissive property.

The refractive index of such a light reflective substance is at least 1.8, for example. In order to efficiently scatter the light and achieve a high extraction efficiency, the refractive index is preferably at least 2.0, more preferably at least 2.5. The difference in the refractive indices between the light reflective substance and a resin material is, for example, at least 0.4. In order to efficiently scatter the light and achieve a high extraction efficiency, the difference is preferably at least 0.7, more preferably at least 0.9. The median particle size of the light reflective substance particles is preferably at least 0.08 μm, but 10 μm at most in order to achieve a scattering effect at high efficiency, more preferably at least 0.1 μm, but 5 μm at most.

For such a light reflective substance, TiO$_2$ (titanium oxide), ZrO$_2$ (zirconium oxide), MgO (magnesium oxide), MgCO$_3$ (magnesium carbonate), Mg(OH)$_2$ (magnesium hydroxide), CaCO$_3$ (calcium carbonate), Ca(OH)$_2$ (calcium hydroxide), CaSiO$_3$ (calcium silicate), ZnO (zinc oxide), BaTiO$_3$ (barium titanate), Al$_2$O$_3$ (aluminum oxide), or the like, can be used. Among all, TiO$_2$ is preferable as it is relatively stable against moisture, has a high refractive index, and superior thermal conductivity.

In order to achieve even higher reflectance, it is preferable to use TiO$_2$ as the light reflective substance in cases where the light emitting element 1 emits visible light, and Al$_2$O$_3$ for ultraviolet light.

Figure 3:
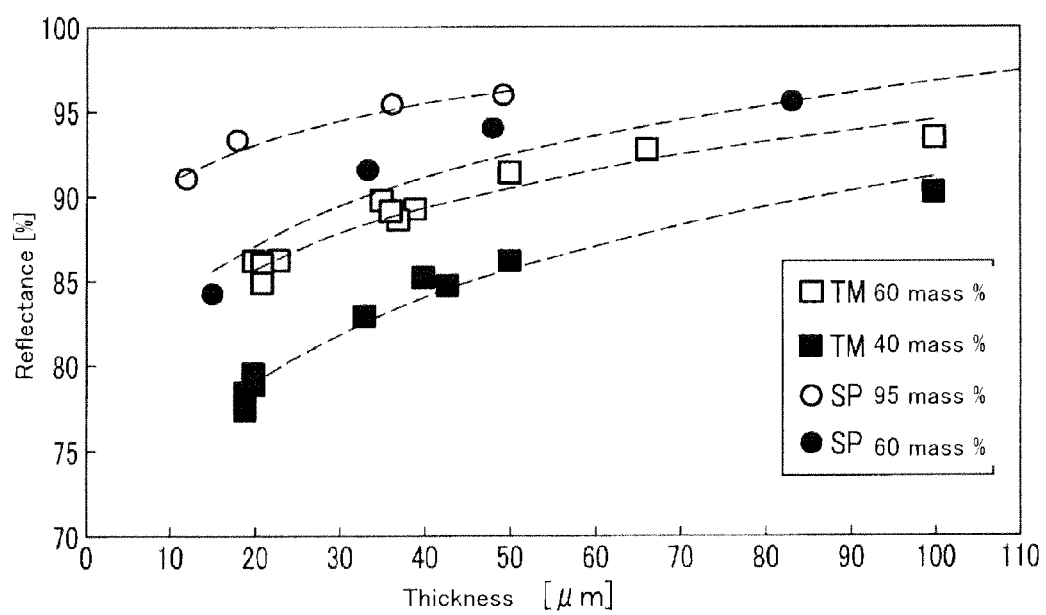
FIG. 3 is a graph showing the relationship between the thickness of a light reflective member and the reflectance for various contents of a light reflective substance.

Now, specific examples of the reflective indices of the first layer 21 and second layer 22 of the light reflective member 2 will be explained with reference to FIG. 3. FIG. 3 shows the reflectance measured in the experiment conducted where the reflective films for assumed uses in the first layer 21 and second layer 22 having various light reflective substance contents and film thicknesses were prepared.

In this experiment, TiO$_2$ particles having a median particle size of 0.2 μm were used as the light reflective substance, and a silicone resin was used as the light-transmissive resin material to form the reflective films. For the assumed use as the first layer 21, the reflective films having a TiO$_2$ content of 95 mass % (plotted with white circles "○") and 60 mass % (plotted with black circles "●") were prepared by spraying. For the assumed usage as the second layer 22, the reflective films having a TiO$_2$ content of 60 mass % (plotted with white squares "□") and 40 mass % (plotted with black squares "■") were prepared by transfer molding (TM).

As is clear from FIG. 3, the higher the content of the light reflective substance, TiO$_2$, and the higher the film thickness, the higher the reflectance results.

Moreover, reflective films having TiO$_2$ contents of 95 mass %, 60 mass %, and 40 mass %, each having a thickness of 30 μm, were formed on the side faces of LED chips in Test Samples 1 to 3.

TABLE 1 shows the frontal emission outputs of the LEDs measured in the experiment.

Now, the values for Test Samples 1 and 2 shown are relative values assuming that the LED emission output of Test Example 3 is "100."

The reflective films in Test Samples 1 and 2 were formed by spraying, while that in Test Sample 3 was formed by transfer molding. The Test Samples 1-3 the results for which are shown in TABLE 1 were tested only by providing a reflective film in the thickness corresponding to the first layer 21.

TABLE 1

| Test Samples | Forming Method | TiO$_2$ Content (mass %) | Film Thickness (μm) | Reflectance (%) | LED Output (%) |
|---|---|---|---|---|---|
| 1 | Spraying | 90 | 30 | 95 | 115 |
| 2 | Spraying | 60 | 30 | 90 | 110 |
| 3 | Transfer Molding | 40 | 30 | 80 | 100 |

As shown in TABLE 1, Test Sample 2 having a reflective film with a 60 mass % content had a reflectance of 90%, and an light output of 110%, as compared to the 80% reflectance of Test Sample 3 having a film with a 40% content, which is conventionally used as a reflective film. Test Sample 1 having a reflective film with a 95 mass % content, moreover, achieved a reflectance of 95% and an light output of 115%. It is clear from the experiment that a high reflectance can be achieved, and the LED output in the frontal direction can be increased, by replacing a portion of the film thickness of a light reflective member having a conventional light reflective substance content with a thin film having a high content of a light reflective substance.

Referring back to FIGS. 1 and 2, the explanation of the configuration of the light emitting device 100 will be continued.

The wavelength conversion member 3 is provided on the upper face of the light emitting element 1, which is the light extraction face, and is a layer that contains a wavelength conversion substance that converts the light emitted by the light emitting element 1 into light having a different wavelength.

Wavelength conversion substances are phosphors, and the wavelength conversion member 3 can be formed by using, for example, a light-transmissive resin which contains phosphor particles. For the resin material, the same resin as that for the light reflective member 2 discussed earlier can be used. Moreover, the wavelength conversion member 3 can contain particles of a light diffusing substance in order to impart light diffusion properties. For the light diffusing substance, any of the light reflective substances mentioned earlier can be used.

The thickness of the wavelength conversion member 3 can be determined in accordance with the phosphor content, the color tone obtained after mixing the light emitted from the light emitting element 1 with the light after wavelength conversion, and the like. The thickness can be set, for example, to at least 1 μm, but 1000 μm at most, preferably at least 5 μm, but 500 μm at most, and more preferably at least 10 μm, but 200 μm at most.

In this embodiment, the wavelength conversion member 3 is provided to extend over the upper face of the light reflective member 2, but may be provided only on the light emitting element 1. The wavelength conversion member 3, moreover, is not an essential constituent element, and can be omitted. Alternatively, in lieu of the wavelength conversion member 3, a light diffusive member which contains a light diffusive substance, or a transparent layer which serves as a protective film, may be provided.

There are no particular limitations for the phosphors (wavelength conversion substances) as long as the fluorescent substance is excited by the light emitted by the light emitting element 1 and emits light having a different wavelength than that of the excitation light, and a phosphor in particle form can suitably be used. Since phosphor particles scatter and reflect light, they also function as a light scattering member in addition to converting the wavelength, achieving a light diffusion effect. Phosphors are preferably uniformly dispersed within the resin layer in which they are contained.

In cases where the wavelength conversion member 3 is formed by spraying, moreover, it is preferable to set the average particle size of the phosphor to about 2.5-30 μm so the prepared slurry of a solvent and thermosetting resin can be spray-coated. The average phosphor particle size is determined in accordance with the air permeability method or FSSS (Fisher sub-sieve sizer) number (the so-called "D bar" (bar over D) value).

For the phosphor materials, any of those known in the art can be used. They include, for example, nitride-based phosphors, such as cerium-activated YAG (yttrium aluminum garnet)-based phosphors which emits green to yellow light, cerium-activated LAG (lutetium aluminum garnet) which emits green light, europium- and/or chromium-activated calcium aluminosilicate ($CaO-Al_2O_3-SiO_2$)-based phosphors which emits green to red light, europium-activated silicate (($Sr,Ba)_2SiO_4$)-based phosphors which emits blue to red light, β-SiAlON phosphors which emits green light, and CASN- or SCASN-based phosphors which emits red light; KSF ($K_2SiF_6$:Mn)-based phosphors which emits red light; and sulfide-based phosphors which emits green or red light.

The phosphor materials, moreover, may be light emitting substances referred to as nanocrystals or quantum dots. Examples of these materials include semiconductor materials, for example, II-VI, III-V, and IV-IV semiconductors, more specifically nanosized highly dispersed particles of CdSe, core-shell type $CdS_xSe_{1-x}$/ZnS, GaP, InAs, and the like. These phosphors can be set to a particle size, for example, of 1-100 nm, preferably about 1-20 nm (about 10-50 atoms). Using phosphors of these particle sizes can suppress the internal scattering, suppressing the scattering of the color-converted light thereby further increasing the transmissive property of the wavelength conversion member 3.

The mounting substrate (substrate) 9 is a submount for mounting the light emitting element 1 to convert it into a package. The mounting substrate 9 shown in FIG. 1 is an oblong rectangle in a plan view, and is configured with a tabular base 91, and wiring electrodes 92n and 92p which are disposed at the left and right longitudinal ends of the base 91 so as to bend around from the upper face to the lower face of the base 91.

The mounting substrate 9 is formed in a size to include the light emitting element 1 in a plan view. The wiring electrodes 92n and 92p are joined to the n-side electrode 13 and p-side electrode 15, respectively, via a conductive adhesive material 93 such as solder.

The light reflective member 2 which covers the side faces of the light emitting element 1 is disposed on the upper face of the mounting substrate 9, so as to adhere its lower face thereto. The exposed sections of the wiring electrodes 92n and 92p are used as external connection terminals.

The mounting substrate 9 is not an essential element, and can be omitted. In cases where no mounting substrate 9 is provided, a CSP (chip size package or chip scale package) type light emitting device can be configured by providing plated terminals on the n-side electrode 13 and p-side electrode 15 as external connection electrodes (see the fourth embodiment discussed later).

[Light Emitting Device Operation]

Subsequently, the operation of the light emitting device 100 will be explained with reference to FIG. 1 (FIG. 2 when appropriate).

For the purpose of explanation, it is assumed that the light emitting element 1 emits blue light, and the wavelength conversion member 3 absorbs blue light and emits yellow light.

In the case of the light emitting device 100 shown in FIG. 1, the active layer 12a of the light emitting element 1 emits blue light when current is supplied between the n-side electrode 13 and p-side electrode 15 from an external power supply via the wiring electrodes 92n and 92p of the mounting substrate 9.

The blue light emitted by the active layer 12a of the light emitting element 1 propagates in the semiconductor stack 12 and growth substrate 11 of the light emitting element 1 to be incident on the wavelength conversion member 3 from the upper face of the light emitting element 1. The light laterally propagating in the light emitting element 1 is reflected by the light reflective member 2 into the light emitting element 1, while the light propagating downwardly is reflected upwardly by the full surface electrode 14, or the like, to be incident on the wavelength conversion member 3 from the light extraction face, which is the substrate 11 side of the light emitting element 1. The light propagating towards the side faces of the light emitting element 1 is efficiently reflected primarily by the first layer 21 of the light reflective member 2. The light that passes through the first layer 21 is reflected by the second layer 22.

One portion of the blue light incident on the wavelength conversion member 3 is absorbed by the phosphors contained in the wavelength conversion member 3, converted the wavelength into yellow light, and extracted from the light emitting device 100. At least a portion of the rest of the blue light incident on the wavelength conversion member 3 is extracted from the light emitting device 100 as blue light as is, without being absorbed by the phosphors. From the light emitting device 100, white light achieved by allowing yellow and blue light to be mixed is extracted.

[Producing Light Emitting Device Production]

The production method for the light emitting device 100 according to the first embodiment shown in FIG. 1 will be explained subsequently with reference to FIGS. 4-8.

Figure 4:
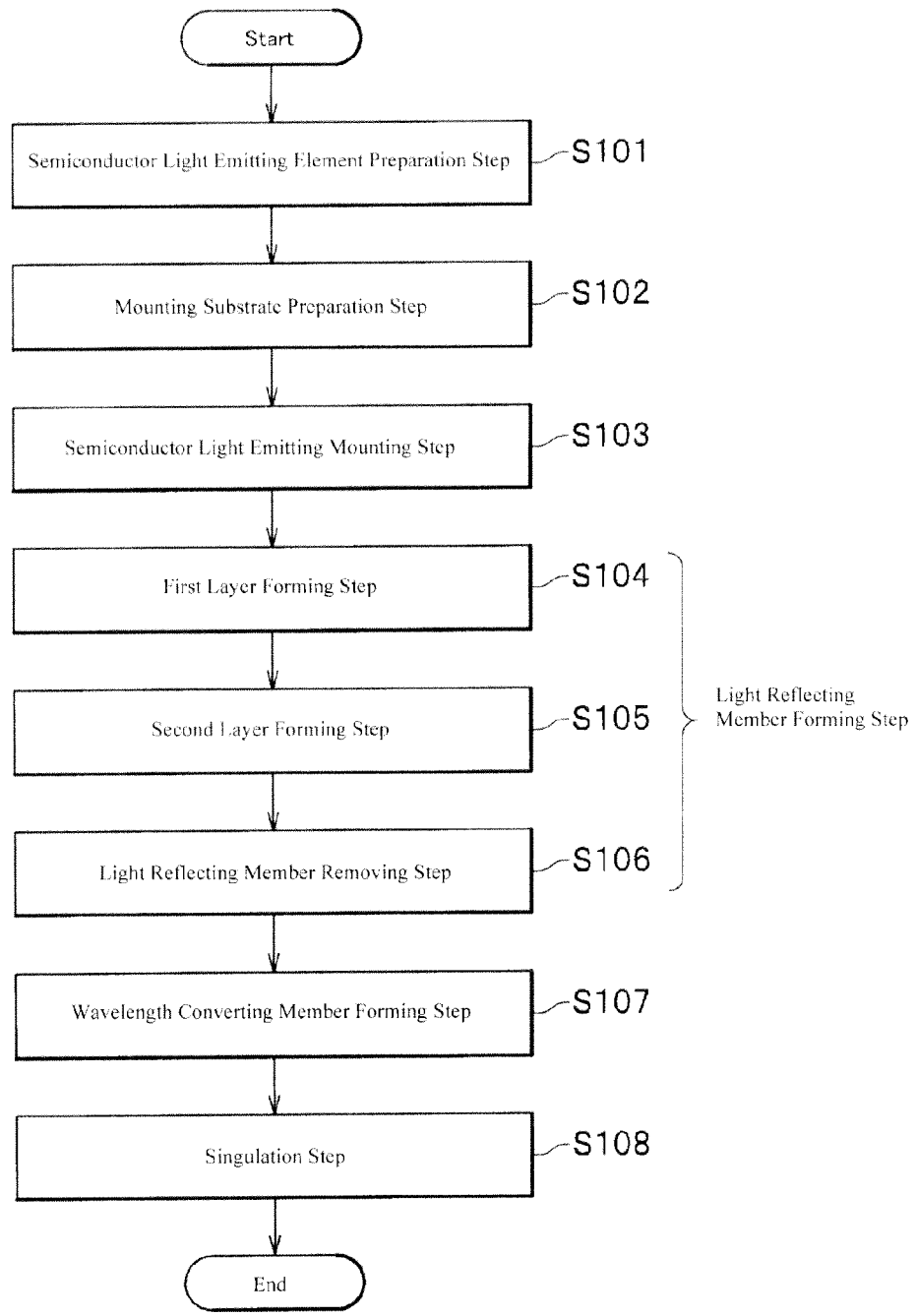
FIG. 4 is a flowchart showing the production method for the light emitting device according to the first embodiment of the invention.

As shown in FIG. 4, the production method for the light emitting device 100 includes a semiconductor light emitting element preparation step S101, mounting substrate preparation step S102, semiconductor light emitting element mounting step S103, first layer forming step S104, second layer forming step S105, light reflective member removing step S106, wavelength conversion member forming step S107, and singulation step S108. The first layer forming step S104, second layer forming step S105, and light reflective member removing step S106 make up the light reflective member forming step.

First, in the semiconductor light emitting element preparation step S101, the light emitting element 1 configured and singulated as shown in FIG. 2 is prepared. One example of the production method for the light emitting element 1 will be explained below, but a commercially available light emitting element 1 may be obtained in place of the semiconductor light emitting element preparation step S101.

More specifically, a semiconductor stack 12 is formed on a growth substrate 11 made of sapphire, or the like, by sequentially stacking an n-type semiconductor layer 12n, active layer 12a, and p-type semiconductor layer 12p using the semiconductor materials described earlier.

After the semiconductor stack 12 is formed, a stepped section 12b, in which the n-type semiconductor layer 12n is exposed at the bottom, is formed in one region of the surface of the semiconductor stack 12 by etching off both the p-type semiconductor layer 12p and active layer 12a entirely, and the n-type semiconductor layer 12n partially.

Subsequently, a full surface electrode 14 having reflectance is formed in the light emitting region having the p-type semiconductor layer 12p and active layer 12a so as to cover substantially the entire upper face of the p-type semiconductor layer 12p.

Then, an insulator 16 made of $SiO_2$, or the like, is formed over the entire surface of the wafer by, for example, sputtering, so as to have openings 16n and 16p at the regions where an n-side electrode 13 will be connected to the n-type semiconductor layer 12n and where a p-side electrode 15 will be connected to the full surface electrode 14, respectively.

Subsequently, an n-side electrode 13, which is a pad electrode, is formed so as to extend from the opening 16n to the upper face of the insulator 16. A p-side electrode 15, which is a pad electrode, is also formed so as to extend from the opening 16*p* to the upper face of the insulator 16.

Wafer form light emitting elements 1 are formed by the steps described above.

Singulated light emitting elements 1 can be produced by splitting the wafer form light emitting elements 1 along predetermined regions by dicing, scribing, or the like.

The back face of the growth substrate 11 may be polished to reduce its thickness prior to cutting the wafer. This can facilitate the cutting step.

Figure 5:
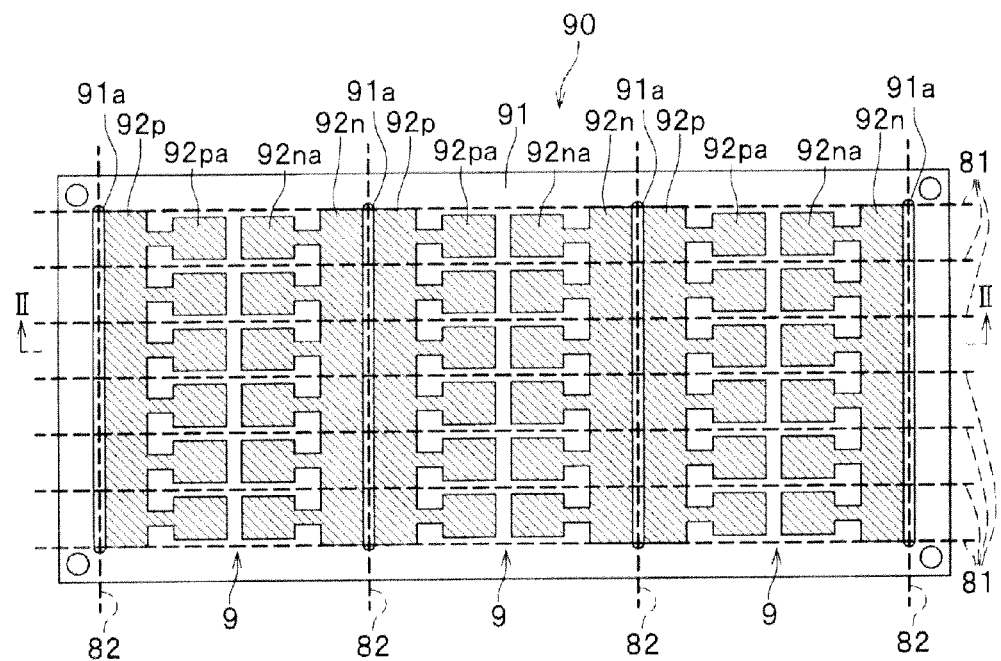
FIGS. 5(a) and (b) are schematic views showing the configuration of a mounting substrate prepared in a mounting substrate preparation step of the production method for the light emitting device according to the first embodiment of the invention where (a) is a plan view, and (b) is a sectional view at line II-II in (a).
Figure 5:
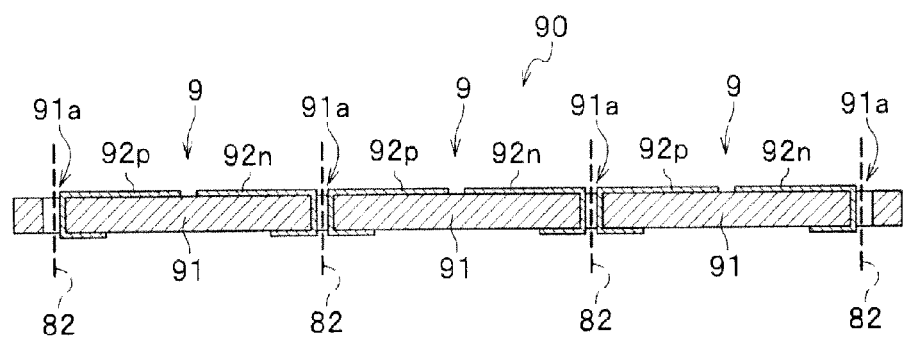

Then, in the mounting substrate preparation step S102, the mounting substrates 9 shown in FIG. 5 are prepared. In the example shown in FIG. 5, mounting substrates are prepared in the form of a substrate assembly 90 where a plurality of mounting substrates 9 of the bases 91 are continuously formed. In this embodiment, moreover, a plurality of light emitting devices 100 are simultaneously formed on the substrate assembly 90 before they are singulated in the singulation step S108.

As shown in FIG. 5, the substrate assembly 90 is comprised of six mounting substrates 9 arranged horizontally, and three arranged vertically. In FIG. 5, individual regions of the mounting substrates 9 are defined by dividing lines 81 and 82. Moreover, grooves 91*a* are created along the dividing lines 82 on the substrate assembly 90 so as to pass through the bases 91 in the thickness direction. Thus, the mounting substrates 9 have already been separated in the horizontal direction. A pair of wiring electrodes 92*n* and 92*p* are provided in correspondence with each mounting substrate 9 so as to extend from the upper face to the lower face of the base 91 via the groves 91*a*. The rectangular regions of the wiring electrodes 92*n* and 92*p* located in the central section of the upper face of each base 91 are connecting sections 92*na* and 92*pa*, respectively, to be connected to the n-side electrode 13 and p-side electrode 15 of the light emitting element 1.

The regions of the wiring electrodes 92*n* and 92*p* located at both ends of each base 91 in the longitudinal direction will serve as the regions for external connection during the secondary mounting.

As far as the semiconductor light emitting element preparation step S101 and mounting substrate preparation step S102 are concerned, either step may precede the other, or they may be performed in parallel. Mounting substrates 9 may be prepared in a singulated format instead of a substrate assembly 90 format. Moreover, the wiring electrodes 92*n* and 92*p* of a mounting substrate 9 may be adapted so that the regions formed on the upper and lower faces of the base 91 are electrically connected via through holes provided in the thickness direction of the base 91. Alternatively, the wiring electrodes 92*n* and 92*p* of a mounting substrate 9 may be disposed only on the upper face of the base 91.

Figure 6:
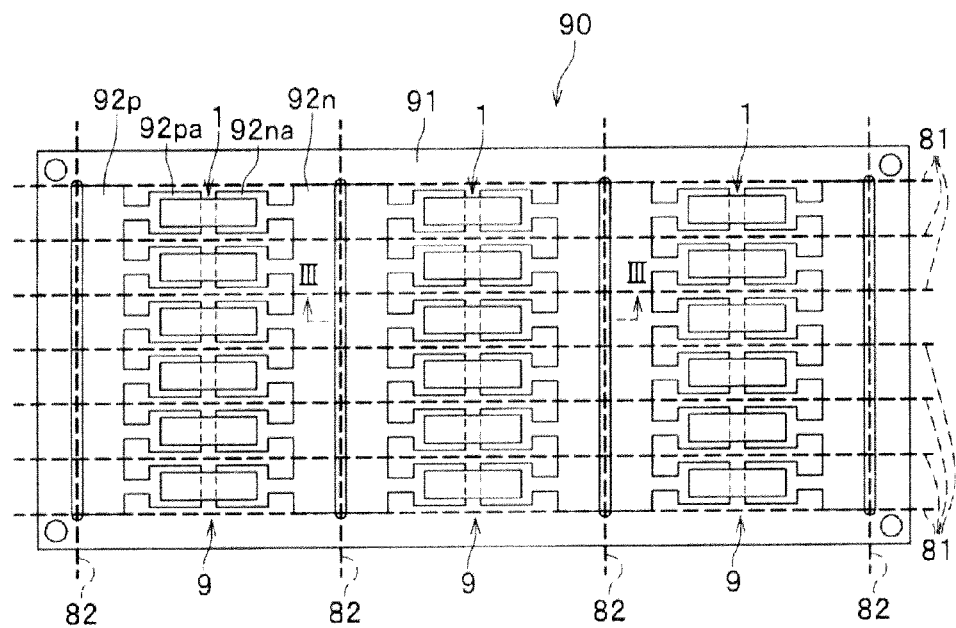
FIGS. 6(a) and (b) are schematic views showing the semiconductor light emitting element mounting step of the production method for the light emitting device according to the first embodiment of the invention where (a) is a plan view, and (b) is a sectional view at line in (a).
Figure 6:
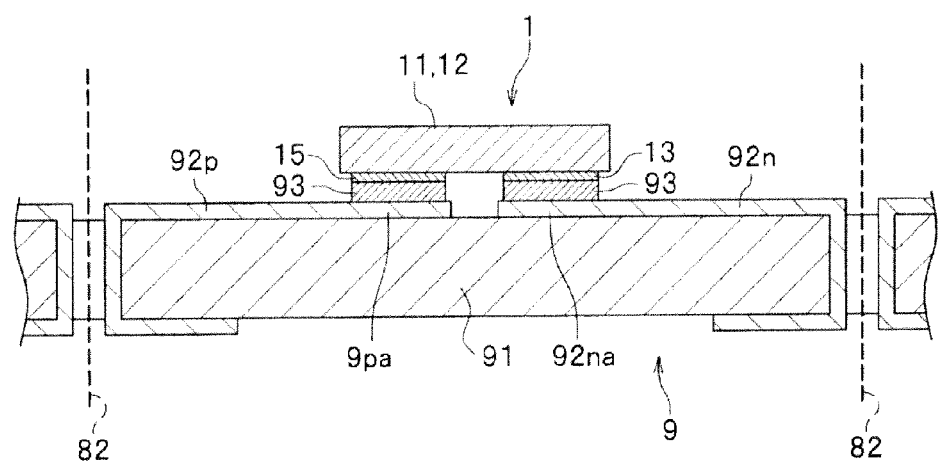

Then, in the semiconductor light emitting element mounting step S103, the light emitting element 1 is mounted on a mounting substrate 9 as shown in FIG. 6.

As illustrated in FIG. 6, the light emitting element 1 is flip chip mounted on the mounting substrate 9 by joining the n-side electrode 13 with the connecting section 92*na* of the wiring electrode 92*n*, and the p-side electrode 15 with the connecting section 92*pa* of the wiring electrode 92*p*, by using a conductive adhesive material 93, such as solder.

Subsequently, in the light reflective member forming step, a light reflective member 2 is formed on the side faces of the light emitting element 1. This step, as mentioned earlier, includes the first layer forming step S104, second layer forming step S105, and light reflective member removing step S106.

Figure 7:
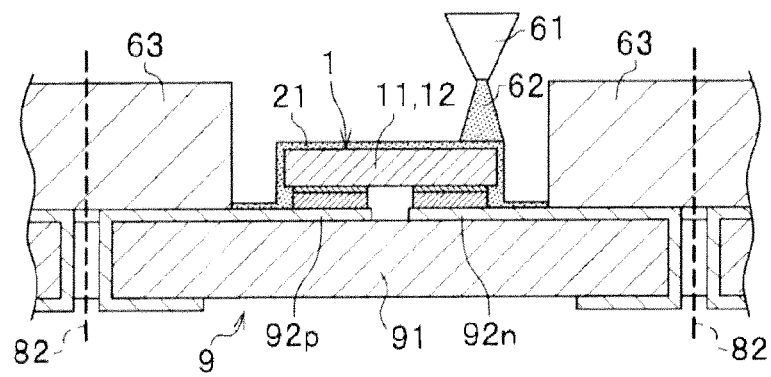
FIGS. 7 (a)-(d) are schematic sectional views showing the following steps of the production method for the light emitting devices according to the first embodiment: (a) first layer forming step, (b) second layer forming step, (c) light reflective member removing step, and (d) wavelength conversion member forming step.
Figure 7:
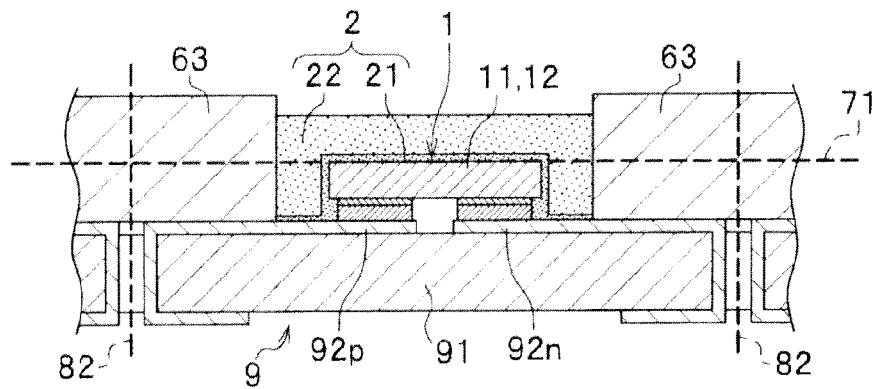
Figure 7:
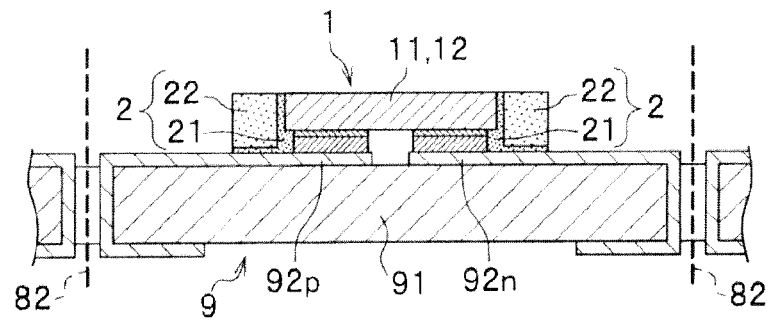
Figure 7:
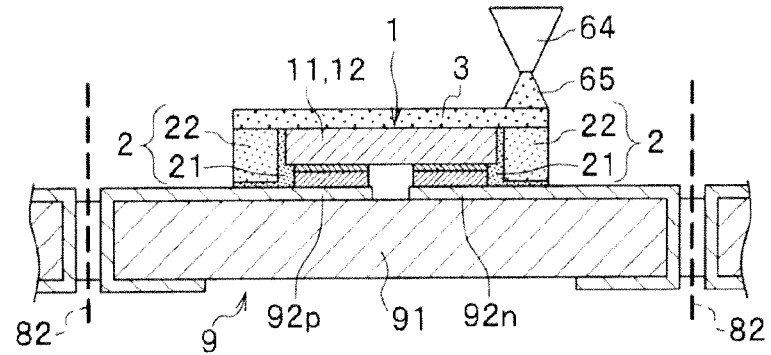

First, in the first layer forming step S104, the first layer 21 of the light reflective member 2 is formed so as to cover the side faces of the light emitting element 1 as shown in FIG. 7(*a*).

FIG. 7(*a*) is a sectional view at the position corresponding to line in FIG. 6(*a*). The same is true for FIGS. 7(*b*)-(*d*).

In this embodiment, as shown in FIG. 7(*a*), a coating is formed on the surface of the light emitting element 1 by spraying a slurry spray 62 comprised of a solvent which contains a thermosetting resin and particles of a light reflective substance, by using a spraying device 61. Heating the coating thereby curing the thermosetting resin can form the first layer 21 in which the light reflective substance particles are tightly bound together.

Before spraying the slurry mentioned above, a masking tape 63 is applied on the upper face of the mounting substrate 9, excluding the areas where the light emitting element 1 is mounted and its vicinity. The tape 63 is removed after the coating step is completed. This can prevent the coating from being formed in the regions of the upper face of the mounting substrate 9 where the wiring electrodes 92*n* and 92*p* will be externally connected. In this step, the coating is also formed on the upper face of the light emitting element 1 and in some portions of the upper face of the mounting substrate 9 in the vicinity of the light emitting element 1 in addition to the side faces of the light emitting element 1.

In this embodiment, moreover, the tape 63 is placed so as not to cover the regions where the first layer 21 and second layer 22 will be formed. The tape 63 is not removed in this step, and is used as a frame for forming the second layer 22 in the following second layer forming step S105. The tape 63 is not particularly limited to any kind as long as it is resistant to chemicals, such as the solvent used in the slurry described above, and removable by being peeled off or dissolved by a suitable chemical.

As for the forming method for the first layer 21, besides the spraying mentioned above, various other coating methods, such as inkjet, potting, screen printing, or the like, can be used. However, spraying is preferable for high-precision coating of a resin material having a high content of light reflective particles. A pulsed spray method, which is a coating method to intermittently apply the spray 62, is particularly preferable, as it can form the coating to a thickness with even higher precision.

Now, the pulsed spray method will be explained.

Since the amount of material being sprayed can be reduced in pulsed spraying, a thin film can be formed with a reduced coating amount per spray application. By repeating spray applications multiple times, the coating can be formed to a thickness with high precision. Moreover, using a thermosetting resin as the resin material, and pre-curing the thermosetting resin between multiple spray applications, such as every application or predetermined number of applications (every three times, for example), can prevent the coating from becoming uneven due to dripping or the like, producing a highly uniform coating with good film thickness precision. Pre-curing herein means allowing a film to be cured to the extent that the thermosetting resin-containing slurry is no longer fluid by heating at a temperature below the thermosetting resin's curing temperature.

The slurry applied by the spraying device 61 contains a solvent, thermosetting resin, and particles of a light reflective phosphor. The slurry is adjusted to an appropriate viscosity to the extent that it can be sprayed.

For the thermosetting resin, any of the resin materials described earlier can be used. For the solvent, an organic solvent, such as n-hexane, n-heptane, toluene, acetone, or the like, can be used.

The spraying device suitable for pulsed spraying and slurry coating are explained in detail in Reference Materials 1 and 2, for example. Thus, further explanation will be omitted.

(Reference 1) Japanese Unexamined Patent Application Publication No. S61-161175.

(Reference 2) Japanese Unexamined Patent Application Publication No. 2003-300000.

Then, in the second layer forming step S105, a second layer 22 is formed so as to cover the outer side of the first layer 21, as shown in FIG. 7(b). At this time, a resin layer having a lower content of the particles of the light reflective substance than the first layer 21 is formed by using the tape 63 used in the previous first layer forming step S104 as a frame. The second layer 22 is formed so that its thickness becomes equivalent to the height of the upper face of the light emitting element 1 or higher. The tape 63 is removed after forming the second layer 22.

For the forming method for the second layer 22, any of the coating methods described to form the first layer 21 can be used. In cases where employing screen printing, or a forming method using a mold, or the like, the tape 63 can be removed beforehand.

In cases where a thermosetting resin is used for both the first layer 21 and second layer 22, it is preferable to pre-cure the first layer 21 in the first layer forming step S104, and then fully cure the first layer 21 together with the second layer 22 in the second layer forming step S105. This can even more tightly join the first layer 21 and second layer 22 together.

Fully curing herein means allowing the thermosetting resin to be completely cured by heating it at its curing temperature or higher.

Then, in the light reflective member removing step S106, the light reflective member 2 (the first layer 21 and second layer 22) is removed to the height indicated by the cutting line 71 shown in FIG. 7(b), i.e., the height of the upper face of the light emitting element 1, by using a cutting device. This exposes the upper face, the light extraction face, of the light emitting element 1, patterning the light reflective member 2 to cover only the side faces of the light emitting element 1, as shown in FIG. 7(c).

Subsequently, in the wavelength conversion member forming step S107, a wavelength conversion member 3 is formed on the upper face of the light emitting element 1 and the upper face of the light reflective member 2, as shown in FIG. 7(d). The wavelength conversion member 3 can be formed using the same forming method as that for the first layer 21 and second layer 22 of the light reflective member 2. In the example shown in FIG. 7(d), the wavelength conversion member 3 is formed by spraying a slurry spray 65 comprised of a solvent which contains thermosetting resin and phosphor particles (wavelength conversion substance), using a spraying device 64.

In cases where a wavelength conversion member 3 is formed by spraying, it is preferable to preliminary cover the surface using, for example, a masking tape, excluding the upper faces of the light emitting element 1 and light reflective member 2.

The wavelength conversion member 3 may be separately produced ahead of time as a sheet material having a predetermined shape, and glued onto the upper faces of the light emitting element 1 and light reflective member 2 by using a light-transmissive adhesive.

Figure 8A:
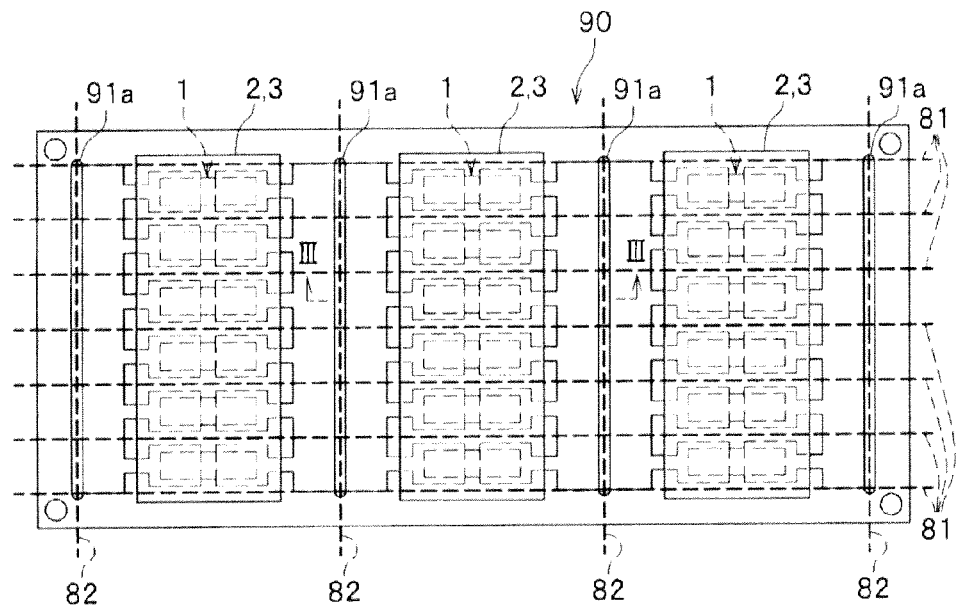
FIGS. 8(a) and (b) are schematic views showing the singulation step for the light emitting device according to the first embodiment of the invention where (a) is a plan view, and (b) is a sectional view at line in (a).
Figure 8B:
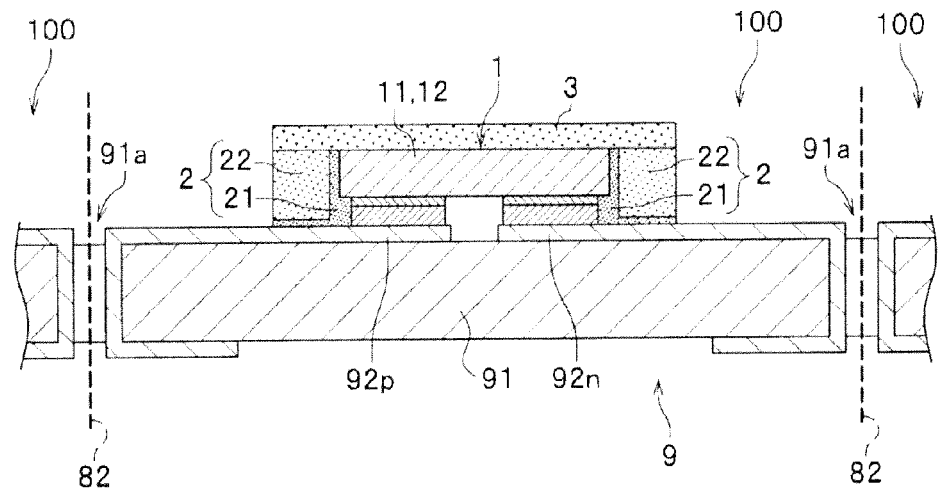

Then, in the singulation step S108, the light emitting devices 100 are singulated by cutting the mounting substrates 9 and light reflective members 2 along the dividing lines 81, as shown in FIG. 8(a). As discussed earlier, the mounting substrates 9 have already been separated by the grooves 91a from adjacent light emitting devices 100 in the horizontal direction. Thus, no cutting along the dividing lines 82 is necessary.

Second Embodiment

Light Emitting Device Configuration

Subsequently, the light emitting device according to a second embodiment will be explained with reference to FIG. 9.

Figure 9:
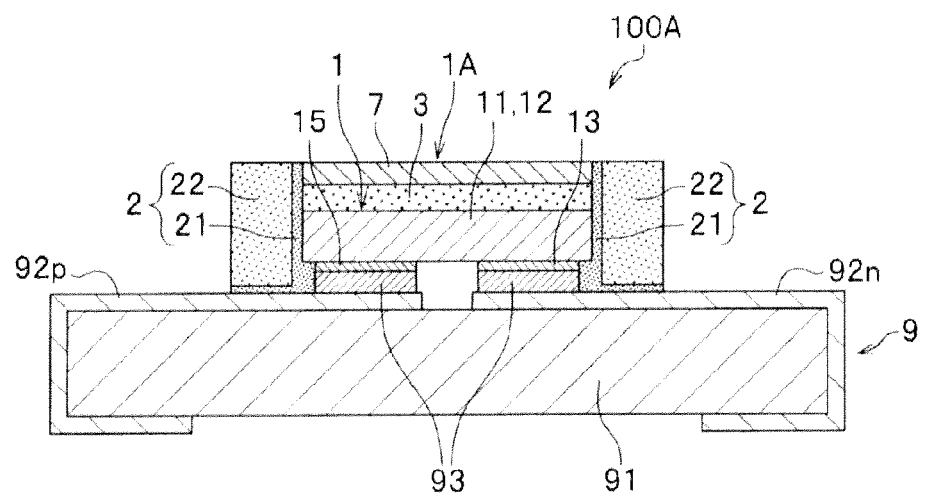
FIG. 9 is a schematic sectional view showing the configuration of the light emitting device according to a second embodiment.

As shown in FIG. 9, the light emitting device 100A according to the second embodiment is different from the light emitting device 100 in the first embodiment shown in FIG. 1 such that the wavelength conversion member 3 is provided only on the upper face of the light emitting element 1; a transparent layer 7 is provided on the upper face of the wavelength conversion member 3; and the light reflective member 2 is provided to the height that covers the side faces of the wavelength conversion member 3 and transparent layer 7.

In the light emitting device 100A, the wavelength conversion member 3 is provided in the same region as that of the upper face of the light emitting element 1 in a plan view, and its side faces are covered by the light reflective member 2. Thus, the frontal emission luminance (upward direction in FIG. 9) can be further increased.

The transparent layer 7 is disposed to cover the entire upper face of the wavelength conversion member 3, and formed by a film using a light-transmissive resin material. For the resin material, the same resin material as that used for the light reflective member 2 or wavelength conversion member 3 can be used.

Figure 10:
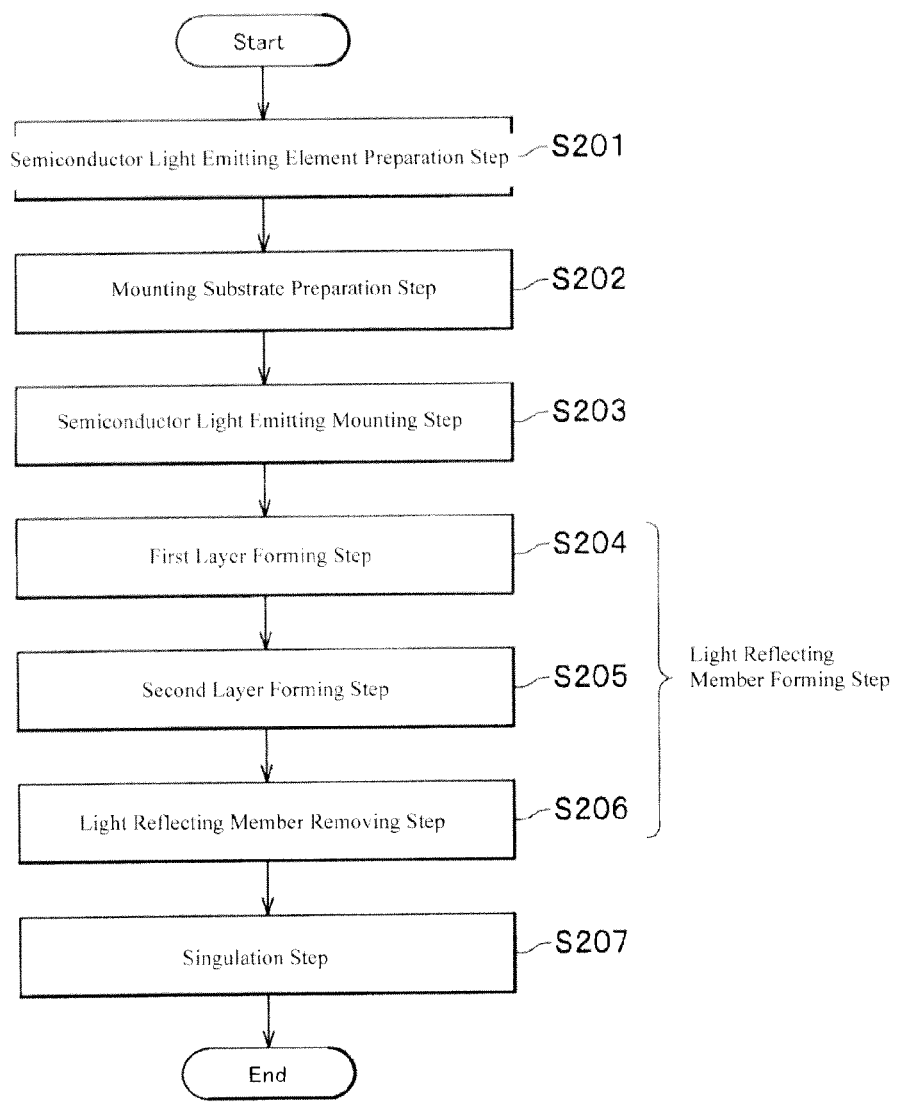
FIG. 10 is a flowchart showing the production method for the light emitting device according to the second embodiment of the invention.

The transparent layer 7 is provided for optically exposing the wavelength conversion member 3 without damaging the wavelength conversion member 3 in the light reflective member removing step S206 where the upper section of the light reflective member 2 is removed (see FIG. 10).

The details of this step will be discussed later.

Light is extracted from the light emitting device 100A via the transparent layer 7.

Except for that, the light emitting device 100A operates in the same manner as the light emitting device 100, and thus the detailed explanation of the same operation will be omitted.

[Producing Light Emitting Device]

Figure 11:
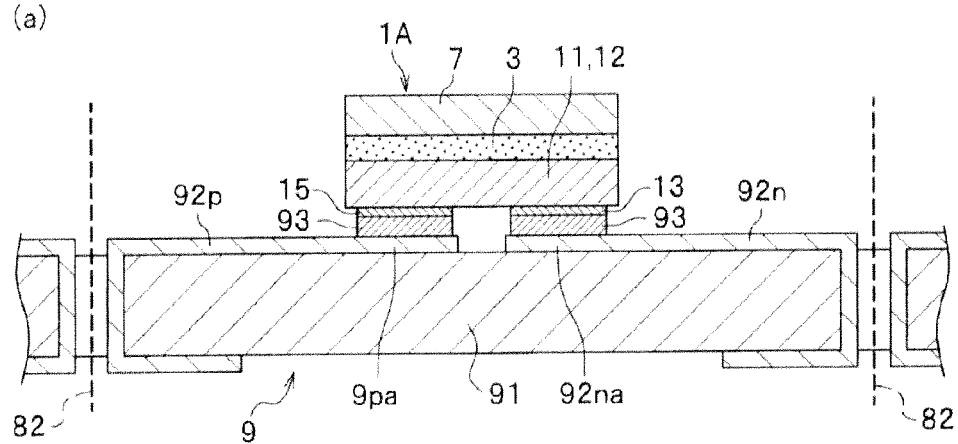
FIGS. 11 (a)-(c) are schematic sectional views showing the following steps of the production method for the light emitting device according to the second embodiment of the invention: (a) semiconductor light emitting element mounting step, (b) second layer forming step, and (c) light reflective member removing step.
Figure 11:
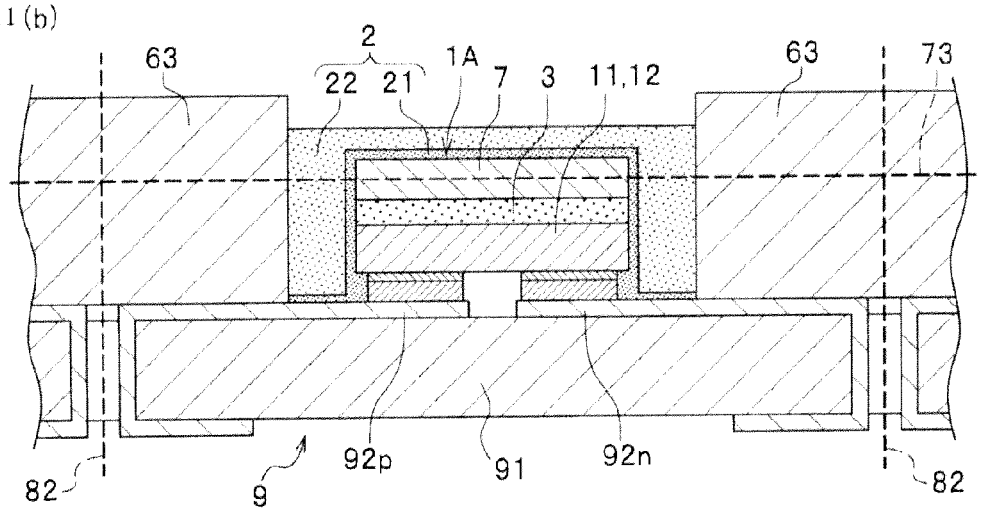
Figure 11:
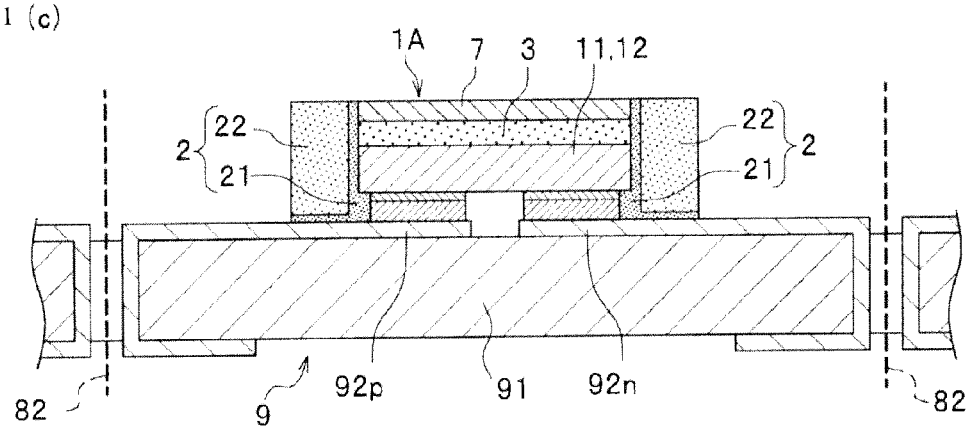

Subsequently, the production steps for the light emitting element 100A according to the second embodiment will be explained with reference to FIGS. 10 and 11.

As shown in FIG. 10, the production steps for the light emitting device 100A includes a semiconductor light emitting element preparation step S201, mounting substrate preparation step S202, semiconductor light emitting element mounting step S203, first layer forming step S204, second layer forming step S205, light reflective member removing step S206, and singulation step S207.

In this embodiment, the step for forming a wavelength conversion member 3 is included in the semiconductor light emitting element preparation step S201. The steps that are different from those for the first embodiment will primarily be explained in detail below with reference to FIG. 11.

First, in the semiconductor light emitting element preparation step S201, the light emitting elements 1 are prepared in the same manner as in the case of the semiconductor light emitting element preparation step S101 in the first embodiment. In this step, before singulating the light emitting elements 1, the wavelength conversion member 3 and transparent layer 7 are formed by sequentially stacking them on the surface of the growth substrate 11 by spraying or the like. Then, by splitting the wavelength conversion member 3 and transparent layer 7 together with the light emitting element 1, a singulated light emitting element 1A having the wavelength conversion member 3 and transparent layer 7 is prepared.

The mounting substrate preparation step S202 is the same as the mounting substrate preparation step S102 in the first embodiment, and thus the explanation will be omitted.

Subsequently, in the semiconductor light emitting element mounting step S203, the light emitting element 1A having the wavelength conversion member 3 and transparent layer 7 is flip chip mounted on a mounting substrate 9 by joining the n-side electrode 13 with the connecting section 92na of the wiring electrode 92n, and the p-side electrode 15 with the connecting section 92pa of the wiring electrode 92p, by using an adhesive material 93 as shown in FIG. 11(a).

Subsequently, the first layer forming step S204 and second layer forming step S205 are performed in the same manner as in the first layer forming step S104 and second layer forming step S105 in the first embodiment, respectively. By these steps, the light reflective member 2 is formed so as to cover the side and upper faces of the light emitting element 1A.

Then, in the light reflective member removing step S206, the light reflective member 2 is cut and removed to the height indicated by the cutting line 73 in FIG. 11(b). This optically exposes the upper face of the wavelength conversion member 3, which is the light extraction face, from the light reflective member 2 as shown in FIG. 11(c). Optically exposing herein means that the transparent layer 7 may be present on the upper face of the wavelength conversion member 3.

The height of the cutting line 73 is set between the lower and upper ends of the transparent layer 7. Although it depends on the method, high film thickness precision can be more readily achieved for the wavelength conversion member 3 by spraying than by cutting. Accordingly, damaging the wavelength conversion member 3, which has been formed on the upper face of the light emitting element 1 with high precision, in the subsequent cutting step would partially or entirely change the color tone.

In this embodiment, therefore, the light extraction face is optically exposed from the light reflective member 2 by forming a transparent layer 7, and then cutting and removing the light reflective member 2 within the range of the thickness of the transparent layer 7.

The thickness of the transparent layer 7 can be set depending on the cutting precision so it is thicker than that corresponds to the cutting precision.

The singulation step S207 can be performed in the same manner as in the case of the singulation step S108 in the first embodiment, and thus the explanation will be omitted.

The light emitting device 100A shown in FIG. 9 is produced as described above.

Third Embodiment

Light Emitting Device Configuration

Subsequently, the light emitting device according to a third embodiment will be explained with reference to FIG. 12.

Figure 12:
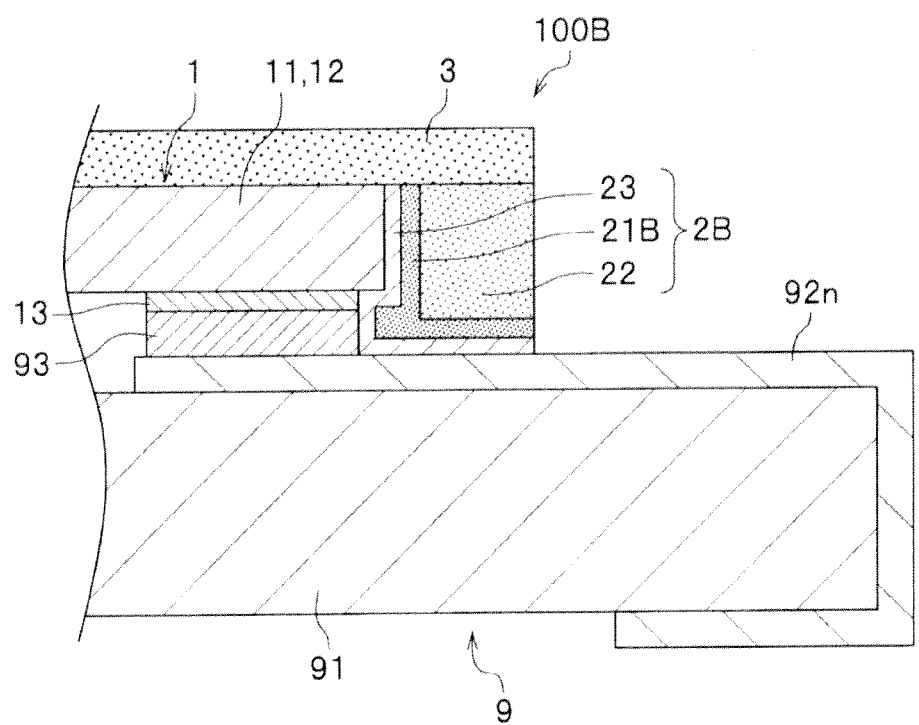
FIG. 12 is a schematic sectional view enlarging a section of the light emitting device according to a third embodiment of the invention.

As illustrated in FIG. 12, the light emitting device 100B according to the third embodiment is different from the light emitting device 100 in the first embodiment shown in FIG. 1 such that it has a light reflective member 2B instead of the light reflective member 2. In the light reflective member 2B, the first layer 21B is provided on the side faces of the light emitting element 1 via a resin rich layer 23.

The first layer 21B, as in the case of the first layer 21 in the first embodiment, has a high content of light reflective substance. When it has a high content of particles of the light reflective substance (for example, 95 mass % or higher), it might not sufficiently adhere to the light emitting element 1 on occasion. In this embodiment, therefore, a resin rich layer 23 which has a low light reflective substance content, that is, high resin content, is provided between the first layer 21B and the light emitting element 1 to increase the adhesion between the two.

For the resin rich layer 23, the same resin material as that for the light reflective member 2 can be used. The resin rich layer does not need to contain any light reflective substance, but when it does, the content is preferably lower than that of the first layer 21B, as well as being the same as, or lower than, that of the second layer 22. Moreover, in order to increase the light reflection efficiency of the first layer 21B, it is preferable to make the resin rich layer 23 thin to the extent that it achieves good adhesion between the first layer 21B and the light emitting element 1. For this purpose, the thickness of the resin rich layer 23 is preferably about the same as, or thinner than, the first layer 21B. More specifically, the thickness of the resin rich layer 23 is preferably at least 1 μm, but 10 μm at most.

The resin rich layer 23 can be formed using various coating methods as in the case of the first layers 21 and 21B described earlier. Pulsed spraying is particularly preferable for uniformly forming the resin rich layer 23 even thinner.

The light emitting device 100B operates the same way as the light emitting device 100 in the first embodiment, and thus the explanation will be omitted.

[Producing Light Emitting Device]

The light emitting device 100B can be produced by following the production method for the light emitting device 100 in the first embodiment, except for forming a resin rich layer 23 after the semiconductor light emitting element mounting step S103, but before the first layer forming step S104.

More specifically, the resin rich layer 23 is formed by spraying, or the like, so as to cover the surface of the light emitting element 1 before forming a first layer 21B in the first layer forming step S104.

In cases where a thermosetting resin is used as the resin materials for the resin rich layer 23 and first layer 21B, it is preferable to allow the resin rich layer 23 applied on the surface of the light emitting element 1 to be air-dried or pre-cured, and then allow it to be fully cured after applying the first layer 21B. This can tightly adhere the light emitting element 1 to the first layer 21B via the resin rich layer 23. The other steps are the same as those in the first embodiment, and thus the explanations will be omitted.

The light emitting device 100B shown in FIG. 12 is formed as described above.

The configuration where the first layer 21B is provided on the side faces of the light emitting element 1 via the resin rich layer 23 is also applicable to the light emitting device 100A according to the second embodiment.

Forth Embodiment

Light Emitting Device Configuration

Subsequently, the configuration of the light emitting device according to a fourth embodiment will be explained with reference to FIG. 13.

Figure 13:
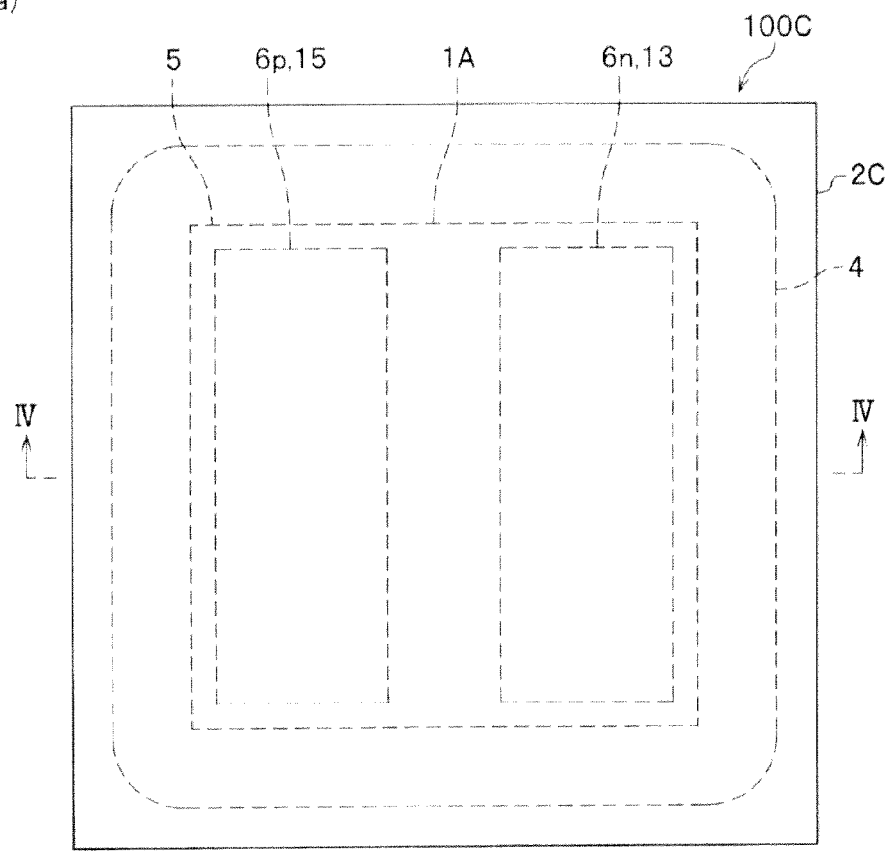
FIGS. 13(a) and (b) are schematic views showing the configuration of the light emitting device according to a fourth embodiment of the invention where (a) is a plan view, and (b) is a sectional view at line IV-IV in (a).
Figure 13:
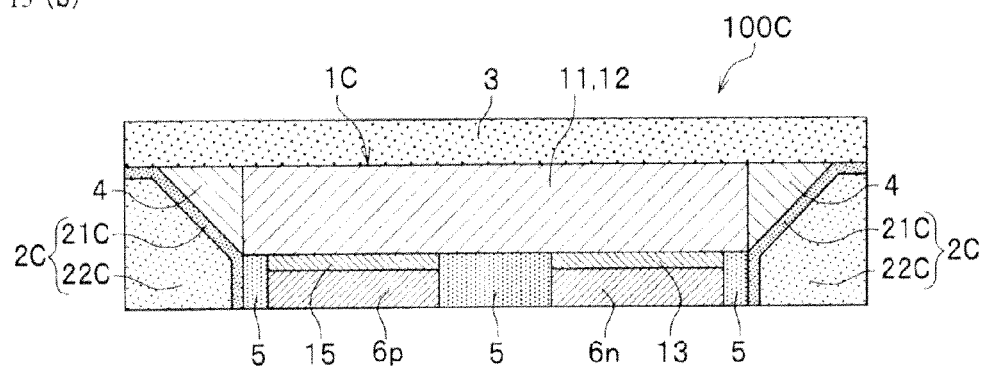

As shown in FIG. 13, the light emitting device 100C according to the fourth embodiment have a light emitting element 1C, light reflective member 2C, wavelength conversion member 3, light-transmissive member 4, supporting member 5, and external connection electrodes 6n and 6p.

The light emitting device 100C differs from the light emitting device 100 shown in FIG. 1 such that it has a light-transmissive member 4 disposed on the side faces of the light emitting element 1C, and the light reflective member 2C is disposed to cover the side faces of the light emitting element 1C via the light-transmissive member 4.

The light emitting device 100C also differs from the light emitting device 100 in the following respects.

The light emitting device 100C has external connection electrodes 6n and 6p, and supporting member 5, instead of a mounting substrate 9, which is a submount, to configure a CSP type package. The light emitting element 1C used in the light emitting device 100C, moreover, is roughly a square in a plan view.

The same reference numerals are assigned to the same constituent elements as those for the light emitting device 100 for which the explanations will be omitted whenever appropriate.

Although the light emitting element 1C has a different outer shape from the light emitting element 1 shown in FIG. 1, it is a flip chip mounting type LED chip having the same cross sectional structure as shown in FIG. 2. The plan view shape of the light emitting element 1C is not particularly limited, and may be a rectangle as in the case of the light emitting element 1.

The light-transmissive member 4 is provided on the side faces of the semiconductor stack 12 and growth substrate 11, which are the side faces of light emitting element 1C (see FIG. 2).

At the bottom of the light emitting element 1C, the external connection electrode 6n which is electrically connected to the n-side electrode 13, the external connection electrode 6p which is electrically connected to p-side electrode 15, and supporting member 5, which is disposed to enclose the perimeters of the external connection electrodes 6n and 6p in a plan view, are provided.

The light-transmissive member 4 is provided in contact with the side faces of the light emitting element 1C so as to surround the outer boundary of the light emitting element 1C in a plan view, and is a fillet for reflective the light exiting from the side faces of the light emitting element 1C in the upward direction, which is the light extracting direction. For this purpose, the light-transmissive member 4 has an outer face sloping outwardly in the light extracting direction with respect to the thickness direction of the light emitting element 1C in a plan view. By providing such a light-transmissive member 4, the light exiting from the side faces of the light emitting element 1 can be extracted more efficiently.

In the example shown in FIG. 13(b), the outer face of the light-transmissive member 4 is planar so it's cross sectional shape is a straight line. The outer face, however, is not limited to this, and may be curved to be downwardly or upwardly concave.

The outer face of the light-transmissive member 4, moreover, is covered by the first layer 21C of the light reflective member 2C, and on the upper face of the light-transmissive member 4, the wavelength conversion member 3 is provided continuously from the section on the upper face of the light emitting element 1. The light exiting from the upper face of the light-transmissive member 4 is extracted via the wavelength conversion member 3.

The light-transmissive member 4 can be formed using a material having good transmissive property, such as a resin, glass, or the like. Moreover, it is preferable to form the light-transmissive member 4 using a material having a higher refractive index than the resin material used for the first layer 21C of the light reflective member 2C. Constructing the light-transmissive member 4 with a material of higher refractive index than the first layer 21C can efficiently reflect the light at its outer face which interfaces with the first layer 21C based on Snell's law.

The light-transmissive member 4 can be formed by supplying a liquid or paste resin material on the side faces of the light emitting element 1C, for example, using a dispenser, and subsequently allowing it to be cured.

The light reflective member 2C has a two-layer structure consisting of a first layer 21C and second layer 22C, and is disposed so as to cover the side faces of the light-transmissive member 4 to reflect the light exiting from the outer face of the light-transmissive member 4 against the light-transmissive member 4. In other words, the light reflective member 2C is provided so as to cover the side faces of the light emitting element 1 via the light-transmissive member 4. Accordingly, the first layer 21C is provided so as to cover the outer face of the light-transmissive member 4, and the second layer 22C is provided so as to cover the outer face of the first layer 21C.

In the example shown in FIG. 13(b), moreover, the light reflective member 2C is disposed so that its bottom face has the same height as that of the bottom face of the supporting member 5.

The first layer 21C and second layer 22C can be formed by using the same materials and methods as those for the first layer 21 and second layer 22 in the first embodiment, respectively.

The wavelength conversion member 3 is disposed so as to cover the upper faces of the light emitting element 1, light-transmissive member 4, and light reflective member 2. Since the only difference between the wavelength conversion member 3 in this embodiment and that in the first embodiment is its outer shape, and thus the detailed explanation will be omitted.

The supporting member 5 is disposed at the bottom face of the light emitting element 1C, the electrode forming face, so as to surround the external connection electrodes 6n and 6p in a plan view to support the external connection electrodes 6n and 6p. The supporting member 5 can be formed by using an insulating resin. The employment of a light sensitive material used as a photoresist is preferable as it enables the patterning of the supporting member 5 by photolithography. Moreover, it is preferable to use a heat resistant material for the supporting member 5 that is formed around the external connection electrodes 6n and 6p so as not to be deformed or denatured during mounting while using an adhesive material such as solder. A resin material, such as silicone-based resin, epoxy-based resin, or polyimide-based resin, for example, can be suitable used.

The external connection electrodes 6n and 6p are electrode terminals to connect the light emitting element 1C to an external power supply. The upper face of the external connection electrode 6n is electrically connected to the n-side electrode 13, while the lower face is used for external connection. Similarly, the upper face of the external connection electrode 6p is electrically connected to the p-side electrode 15, and the lower face is used for external connection.

The external connection electrodes 6n and 6p can be formed, for example, as plated posts by way of electroplating. The external connection electrodes 6n and 6p can also be formed by using metal wires. For the external connection electrodes 6n and 6p, it is preferable to use a metal material having good electrical and thermal conductivity, such as Cu, Au, or the like.

[Light Emitting Device Operation]

Subsequently, the operation of the light emitting device 100C will be explained with reference to FIG. 13 (see FIG. 2 when appropriate).

For the purpose of explanation, it is assumed that the light emitting element 1C emits blue light, and the wavelength conversion member 3 absorbs the blue light and emits yellow light.

In the case of the light emitting device 100C shown in FIG. 13, the active layer 12a of the light emitting element 1C emits blue light when current is supplied between the n-side electrode 13 and p-side electrode 15 from an external power supply via the external connection electrodes 6n and 6p.

The blue light emitted by the active layer 12a of the light emitting element 1C propagates in the semiconductor stack 12 and growth substrate 11, and is extracted from the upper face of the light emitting element 1C via the wavelength conversion member 3. The light propagating laterally in the light emitting element 1C becomes incident on the light-transmissive member 4, is reflected upwardly at the outer surface where the light reflective member 2C is disposed, and extracted via the wavelength conversion member 3. The light propagating downwardly in the light emitting element 1C is reflected upwardly by the full surface electrode 14 or the like, and extracted via the wavelength conversion member 3.

One portion of the blue light incident on the wavelength conversion member 3 is converted into yellow light by the wavelength conversion member 3 to be extracted from the light emitting device 100C, while at least another portion of the blue light is extracted as blue light as is, without being converted. Thus, from the light emitting device 100C, white light achieved by allowing yellow and blue light to be mixed is extracted.

[Producing Light Emitting Device]

Subsequently, the production method for the light emitting device 100C according to the fourth embodiment shown in FIG. 13 will be explained with reference to FIG. 14.

Figure 14:
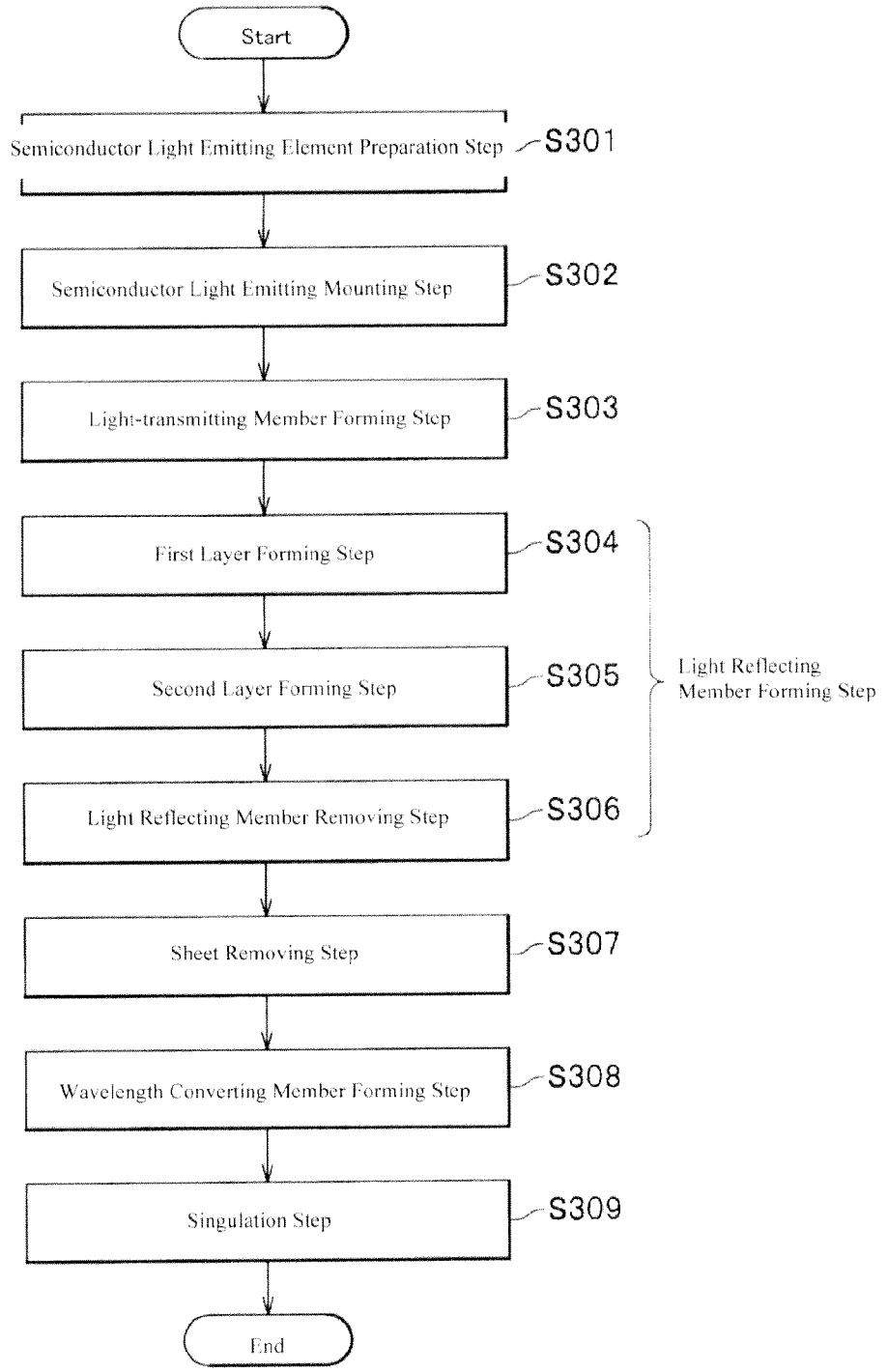
FIG. 14 is a flowchart showing the production method for the light emitting device according to the fourth embodiment of the invention.

As shown in FIG. 14, the production method for the light emitting device 100C includes a semiconductor light emitting element preparation step S301, semiconductor light emitting element mounting step S302, light-transmissive member forming step S303, first layer forming step S304, second layer forming step S305, light reflective member removing step S306, sheet removing step S307, wavelength conversion member forming step S308, and singulation step S309. The first layer forming step S304, second layer forming step S305, and light reflective member removing step S306 make up the light reflective member forming step.

First, in the semiconductor light emitting element preparation step S301, a supporting member 5 and external connection electrodes 6n and 6p are formed to prepare a singulated light emitting element 1C.

For this purpose, light emitting elements 1C are prepared first by following the same procedures as in the semiconductor light emitting element preparation step S101 in the first embodiment (see FIG. 4).

Then, on the electrode forming face of the light emitting element 1C, a supporting member 5 is formed by photolithography using a photoresist. At this point, the supporting member 5 is patterned so as to have openings in the regions where the external connection electrodes 6n and 6p will be formed.

Then, a metal layer which will be an electroplating seed layer is formed on the supporting member 5, including the openings mentioned above, for example, by sputtering.

Subsequently, a metal plated layer to form the external connection electrodes 6n and 6p is formed inside the openings in the supporting member 5 by electroplating using the seed layer as the electrical path.

Then, the upper faces of the supporting member 5 and the metal plated layer are cut at a predetermined height to form a light emitting element 1C equipped with the supporting member 5 and external connection electrodes 6n and 6p.

Alternatively, the steps up to the formation of the supporting member 5 and external connection electrodes 6n and 6p may be performed by a wafer-level step, followed by the singulation of the light emitting elements 1C.

Figure 15:
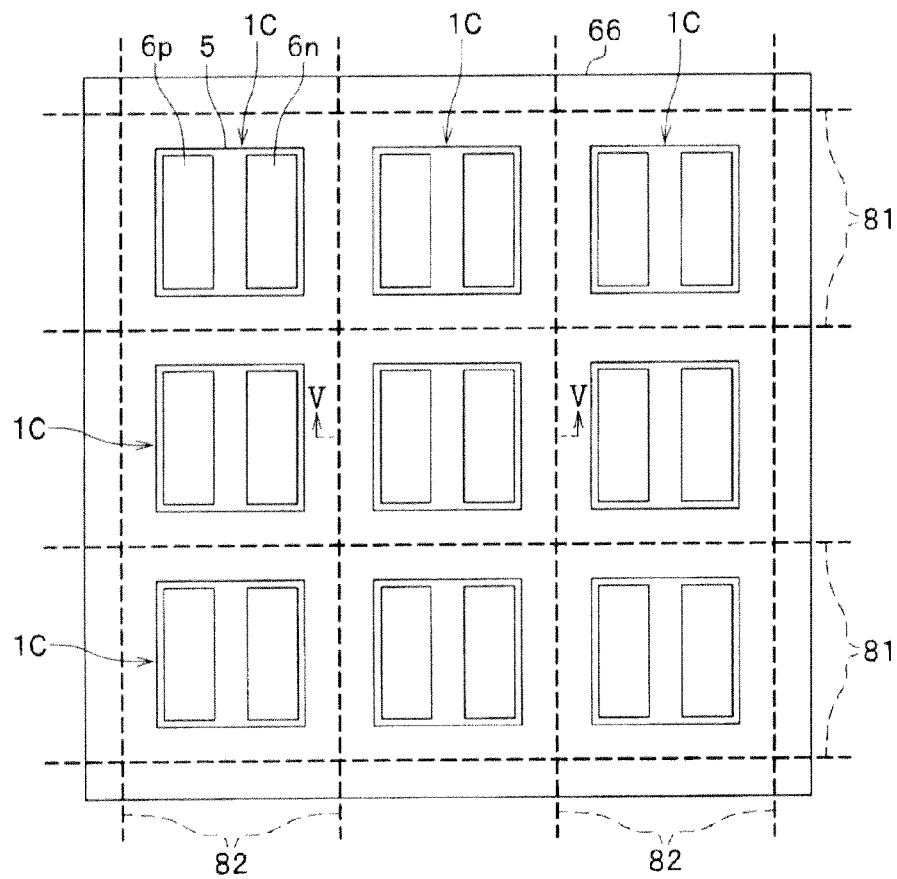
FIGS. 15 (a) and (b) are schematic views showing the semiconductor light emitting element mounting step of the production method for the light emitting device according to the fourth embodiment of the invention where (a) is a plan view, and (b) is a sectional view at line V-V in (a).
Figure 15:
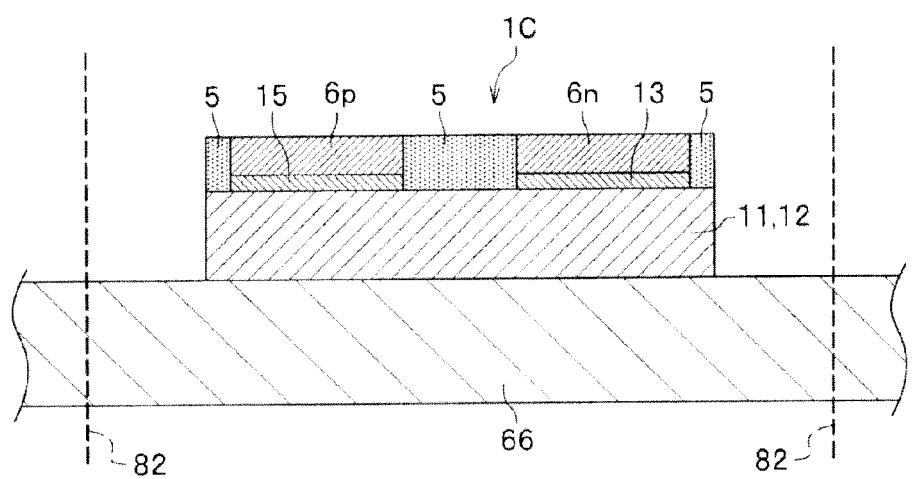

Then, in the semiconductor light emitting element mounting step S302, the light emitting elements 1C equipped with the supporting member 5 and external connection electrodes 6n and 6p are mounted on a sheet 66 having an adhesive surface so that the growth substrate 11 and semiconductor stack 12 face down as shown in FIG. 15. In the example shown in FIG. 15(a), three pieces of light emitting elements 1C are arranged both vertically and horizontally at predetermined intervals. The number of light emitting element 1C mounted may be one, or a larger number than those shown.

In FIG. 15(a), the regions defining individual light emitting devices 100C are shown by dividing lines 81 and 82.

Figure 16A:
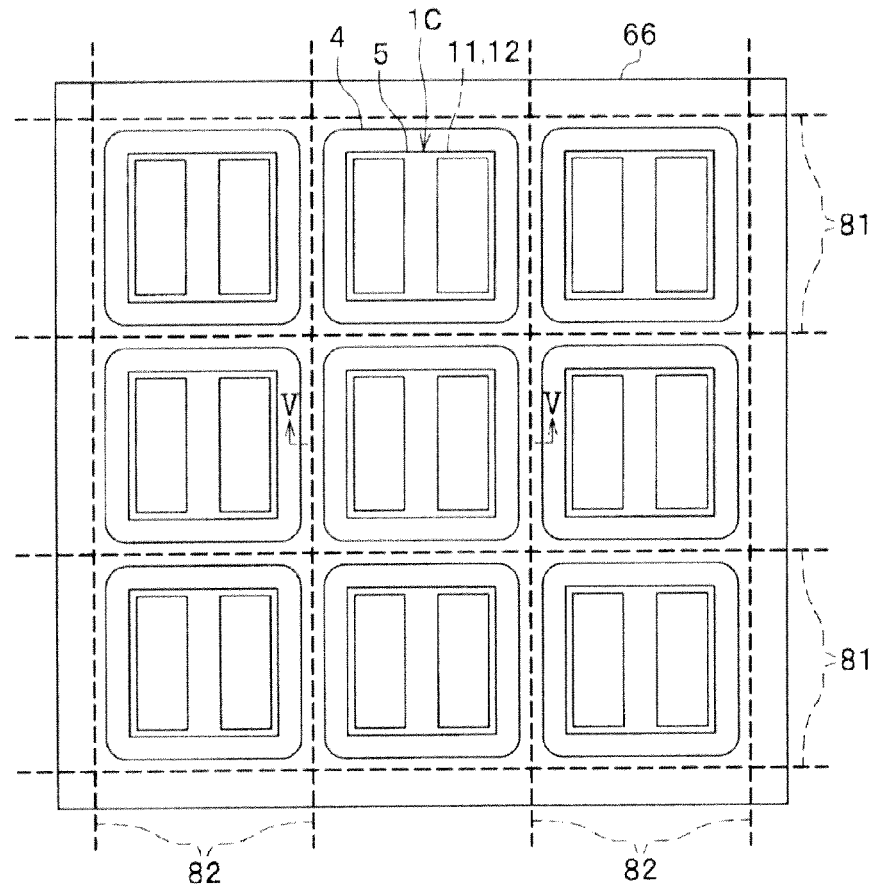
FIGS. 16 (a) and (b) are schematic drawings showing a light-transmissive member forming step for the light emitting device according to the fourth embodiment of the invention where (a) is a plan view, and (b) is a sectional view at line V-V in (a).
Figure 16B:
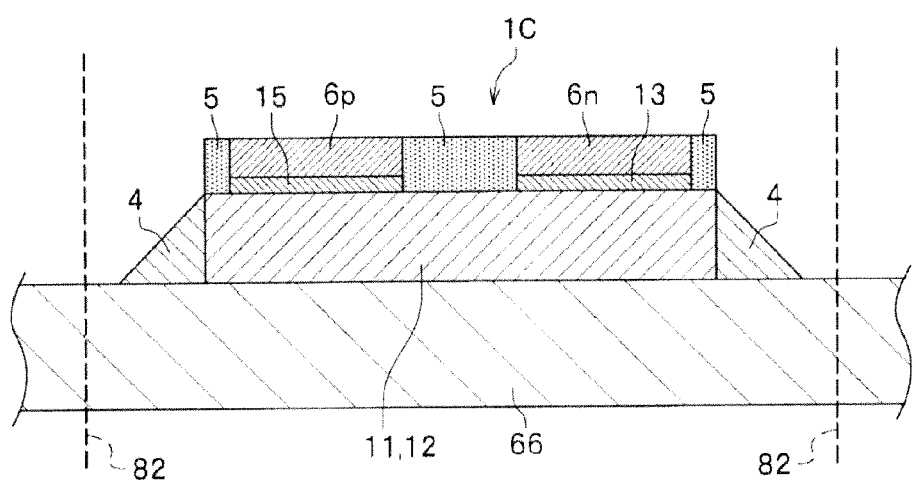

Subsequently, in the light-transmissive member forming step S303, a light-transmissive member 4 is formed on the side faces of light emitting element 1C, that is, the side faces of the growth substrate 11 and semiconductor stack 12, so as to enclose the outer periphery of the light emitting elements 1C in a plan view, as shown in FIG. 16.

The light-transmissive member 4 can be formed, for example, by supplying a light-transmissive resin material using a dispenser, or the like, in contact with the side faces of the light emitting element 1C, and subsequently curing the resin material. It is preferable to form the light-transmissive member 4 with an outer face sloping down outwardly towards the light extraction surface (the bottom face of the light emitting element 1C in FIG. 16(b)) in a plan view. Such a shape can be formed by supplying a resin material having an appropriate viscosity at the corner of the side face of the growth substrate 11 of the light emitting element 1C and upper face of the sheet 66, and allowing the gravity to spread towards the bottom to be cured. Alternatively, the outer face shape may be molded using a mold, followed by curing.

Then, in the light reflective member forming step, a light reflective member 2C is formed so as to cover the outer face of the light-transmissive member 4. This step includes, as mentioned earlier, the first layer forming step S304, second layer forming step S305, and light reflective member removing step S306.

Figure 17:
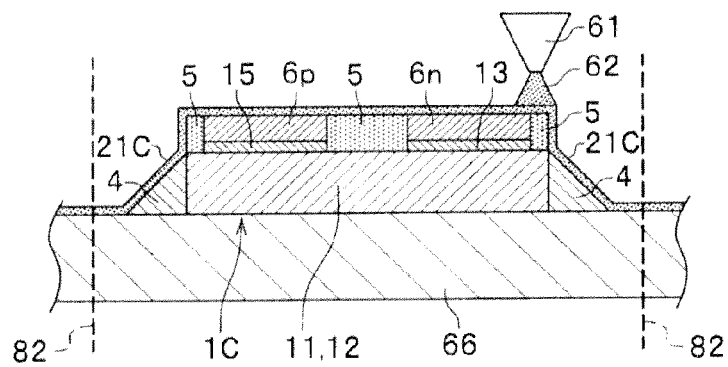
FIGS. 17 (a)-(d) are schematic sectional views showing the following steps of the production method for the light emitting device according to the fourth embodiment of the invention: (a) first layer forming step, (b) second layer forming step, (c) light reflective member removing step, and (d) sheet removing step.
Figure 17:
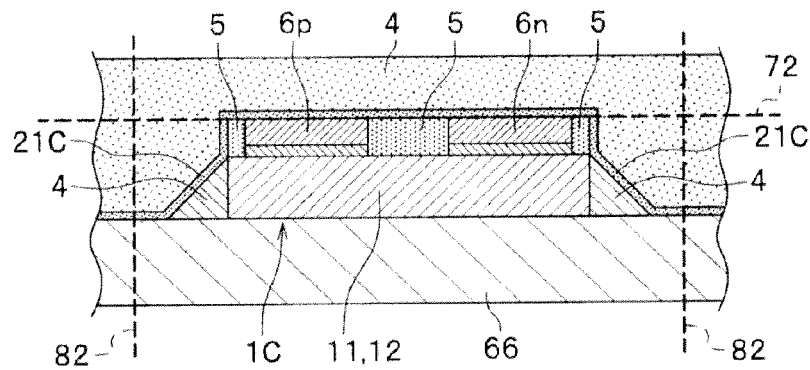
Figure 17:
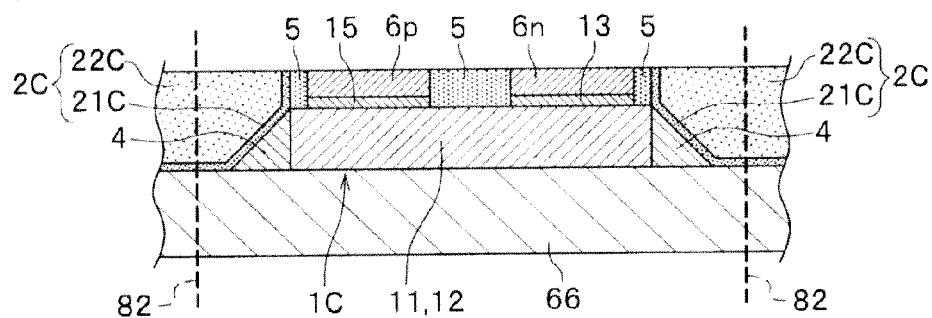
Figure 17:
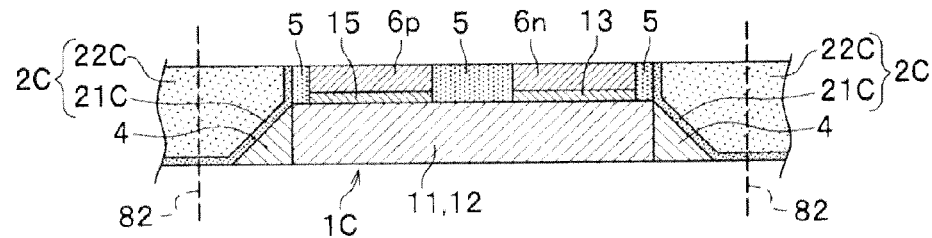

First, in the first layer forming step S304, a first layer 21C of the light reflective member 2C is formed so as to cover the outer face of the light-transmissive member 4, as shown in FIG. 17(a). The first layer 21C is formed by using a spraying device 61 as in the case of the first embodiment.

In this step, the first layer 21C is formed by coating across the entire surfaces of the light-transmissive member 4, supporting member 5, and external connection electrodes 6n and 6p which have been disposed on the sheet 66.

FIG. 17(a) shows a cross section at the location corresponding to line V-V in FIG. 15(a). The same is true for FIGS. 17(b)-(d) and FIG. 18(a)-(b).

Subsequently, in the second layer forming step S305, a second layer 22C is formed so as to cover the outer side of the first layer 21C as shown in FIG. 17(b). At this point, a resin layer having a lower light reflective particle content than the first layer 21C is formed. Moreover, the second layer 22C is formed in the thickness so its height is the same as, or higher than, the upper faces of the external connection electrodes 6n and 6p.

For the second layer 22C, the same forming method as in the case of the first embodiment can be used, and thus the explanation will be omitted.

Then, in the light reflective member removing step S306, the light reflective member 2C (first layer 21C and second layer 22C) is removed to the height shown by the cutting line 72 in FIG. 17(b), that is, the height of the upper faces of the external connection electrodes 6n and 6p, by using a cutting device. This exposes the upper faces of the external connection electrodes 6n and 6p, which will be the sections used for external connection, patterning the light reflective member 2C to cover the side faces of light emitting element 1C via the light-transmissive member 4, as shown in FIG. 17(c).

Then, in the sheet removing step S307, the sheet 66 which is a support for the light emitting element 1C is removed as shown in FIG. 17(d). Since multiple light emitting elements 1C are connected by the light reflective member 2C at this point, they can maintain the arrayed state even when the sheet 66 is removed.

Figure 18:
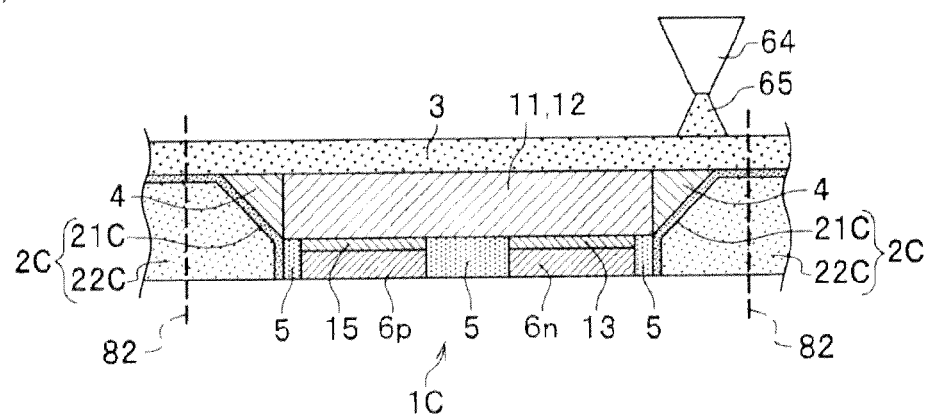
FIGS. 18 (a) and (b) are schematic sectional views showing the following steps of the production method for the light emitting device according to the fourth embodiment of the invention: (a) wavelength conversion member forming step, and (b) singulation step.
Figure 18:
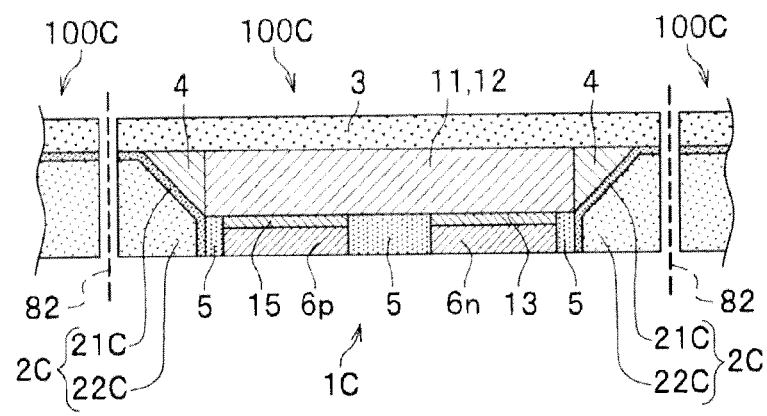

Subsequently, in the wavelength conversion member forming step S308, a wavelength conversion member 3 is formed on the light extraction face side of the light emitting element 1C and light-transmissive member 4, as shown in FIG. 18(a). In FIG. 18(a), the light emitting element 1C is oriented upside down relative to FIG. 17(d). Accordingly, the light extraction face of the light emitting element 1C is shown as the top in FIG. 18(a).

The wavelength conversion member 3 can be formed in the same manner as in the case of the first embodiment, and thus the detailed explanation will be omitted.

Then, in the singulation step S309, as shown in FIG. 18(b), the light emitting devices 100C are singulated by cutting the wavelength conversion member 3 and light reflective member 2C along the dividing lines 82 and 81 (see FIG. 15(a)).

The light emitting element 100C shown in FIG. 13 is prepared as described above.

Fifth Embodiment

Light Emitting Device Configuration

Subsequently, the configuration of the light emitting device according to a fifth embodiment will be explained with reference to FIG. 19.

Figure 19:
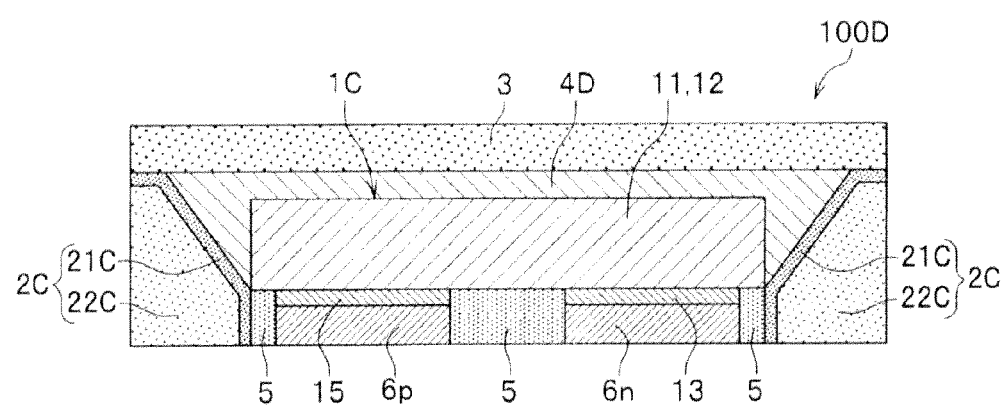
FIG. 19 is a schematic sectional view showing the configuration of the light emitting device according to a fifth embodiment of the invention.

As shown in FIG. 19, the light emitting device 100D according to the fifth embodiment is different from the light emitting device 100C in the fourth embodiment shown in FIG. 13 such that it has a light-transmissive member 4D instead of the light-transmissive member 4.

In the light emitting device 100D, the light-transmissive member 4D is disposed to integrally cover the upper face of the light emitting element 1C in addition to the side faces. Accordingly, the wavelength conversion member 3 is disposed on the upper face of the light emitting element 1C via the light-transmissive member 4D.

The other constituent elements are the same as those of the light emitting device 100C in the fourth embodiment, and thus the explanations will be omitted.

In the light emitting device 100D, among the light emitted by the light emitting element 1C, the light upwardly propagating in the light emitting element 1C becomes incident on the wavelength conversion member 3 via the light-transmissive member 4D. Except for that, it operates the same way as in the case of the light emitting device 100C in the fourth embodiment, and thus the detailed explanation of the operation will be omitted.

[Producing Light Emitting Device]

Subsequently, the production method for the light emitting device 100D according to the fifth embodiment shown in FIG. 19 will be explained with reference to FIGS. 20 and 21.

Figure 20:
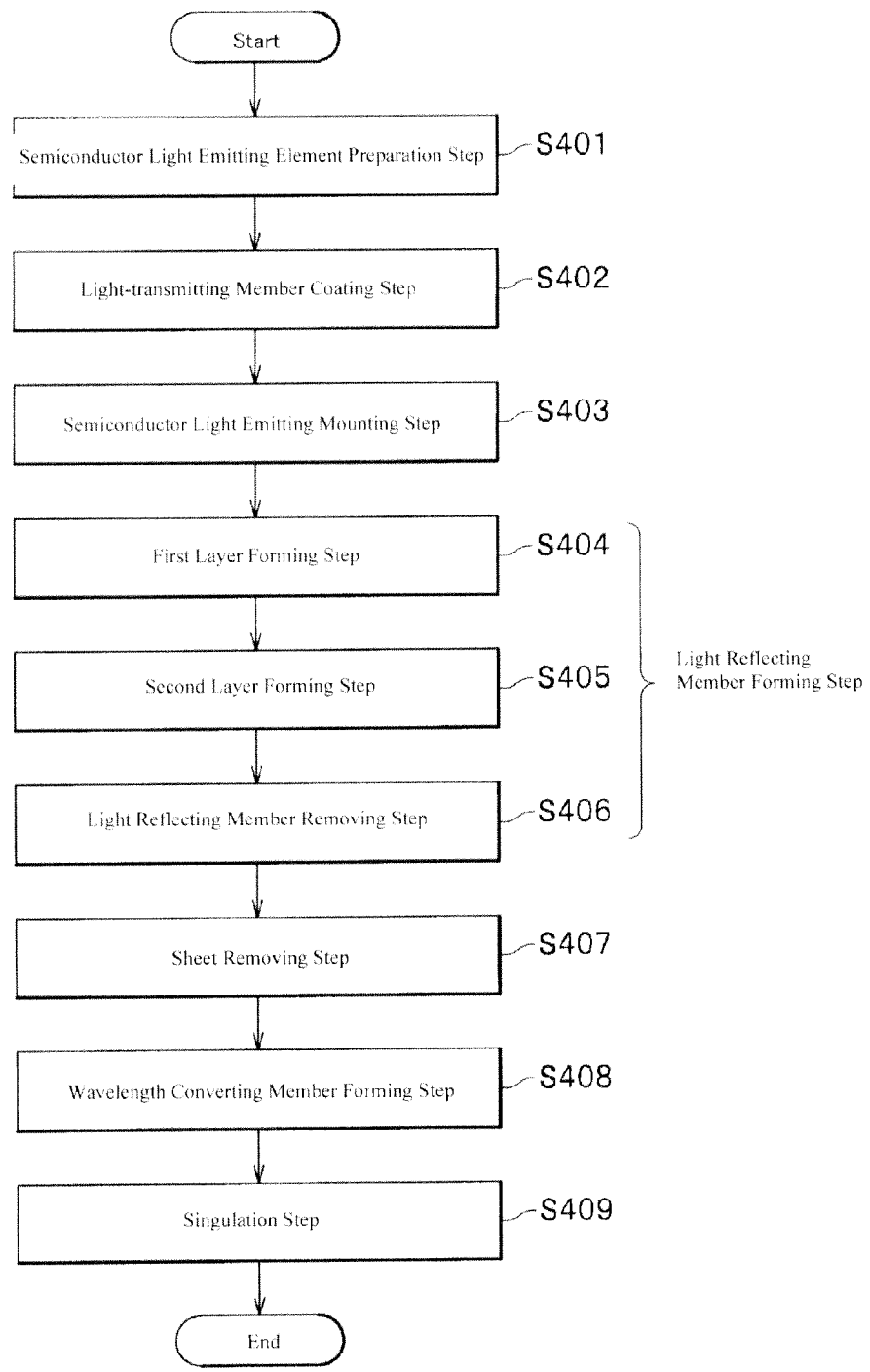
FIG. 20 is a flowchart showing the production method for the light emitting device according to the fifth embodiment of the invention.

As shown in FIG. 20, the production method for the light emitting device 100D includes a semiconductor light emitting element preparation step S401, light-transmissive member coating step S402, semiconductor light emitting element mounting step S403, first layer forming step S404, second layer forming step S405, light reflective member removing step S406, sheet removing step S407, wavelength conversion member forming step S408, and singulation step S409. The first layer forming step S404, second layer forming step S405, and light reflective member removing step S406 make up the light reflective member forming step.

The semiconductor light emitting element preparation step S401 is performed in the same manner as in the case of the semiconductor light emitting element preparation step S301 in the fourth embodiment.

Figure 21:
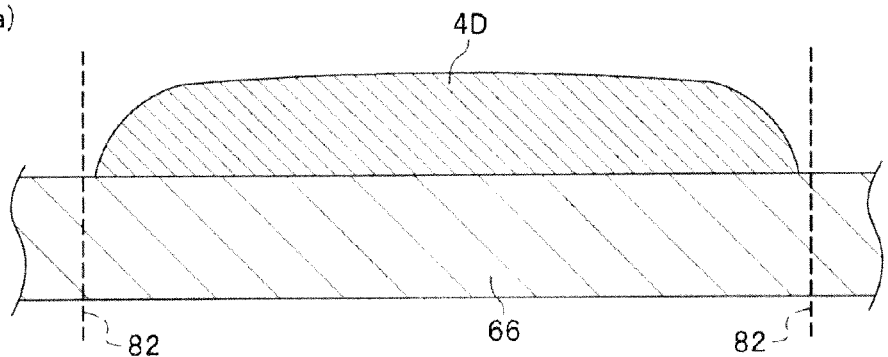
FIG. 21 (a)-(c) are schematic sectional views showing the following steps of the production method for the light emitting device according to the fifth embodiment of the invention: (a) light-transmissive member coating step, (b) semiconductor light emitting element mounting step, and (c) wavelength conversion member forming step.
Figure 21:
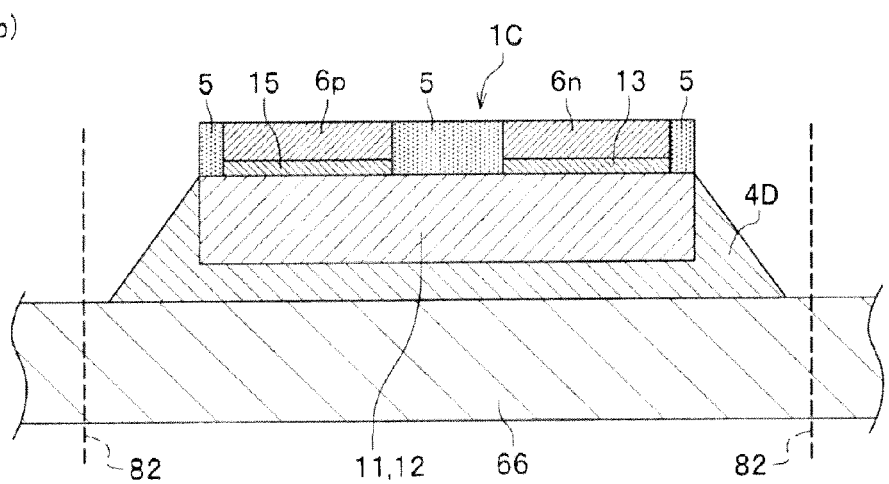

Then, in the light-transmissive member coating step S402, a liquid resin material is applied as the light-transmissive member 4D by a coating method, such as potting, inkjet, or the like, on the sheet 66 in the region where a light emitting element 1C will be mounted (see FIG. 21 (b)), as shown in FIG. 21(a). Here, the coating of the liquid light-transmissive member 4D formed on the sheet 66 bulges over the top by surface tension.

Subsequently, in the semiconductor light emitting element mounting step S403, a light emitting element 1C is mounted on the liquid light-transmissive member 4D as shown in FIG. 21(b). At this point, the light emitting element 1C sinks into the liquid light-transmissive member 4D by its own weight, and as a result, its bottom and side faces are covered by the light-transmissive member 4D. Now, in the light-transmissive member coating step S402, the coated area, amount, viscosity, and the like, of the liquid light-transmissive member 4D are adjusted so that the bottom and side faces of the light emitting element 1C will be covered by the light-transmissive member 4D. It is preferable to use a thermosetting resin for the light-transmissive member 4D in order to easily make such adjustments.

Moreover, the light-transmissive member 4D is cured in the condition where the bottom and side faces of the light emitting element 1C are covered by the light-transmissive member 4D. In cases where a thermosetting resin is used for the light-transmissive member 4D, it can be cured by air-drying and/or heating.

The subsequent first layer forming step S404, second layer forming step S405, light reflective member removing step S406, and sheet removing step S407 are performed in the same manner as in the case of the first layer forming step S304, second layer forming step S305, light reflective member removing step S306, and sheet removing step S307 in the fourth embodiment, respectively.

Figure 21C:
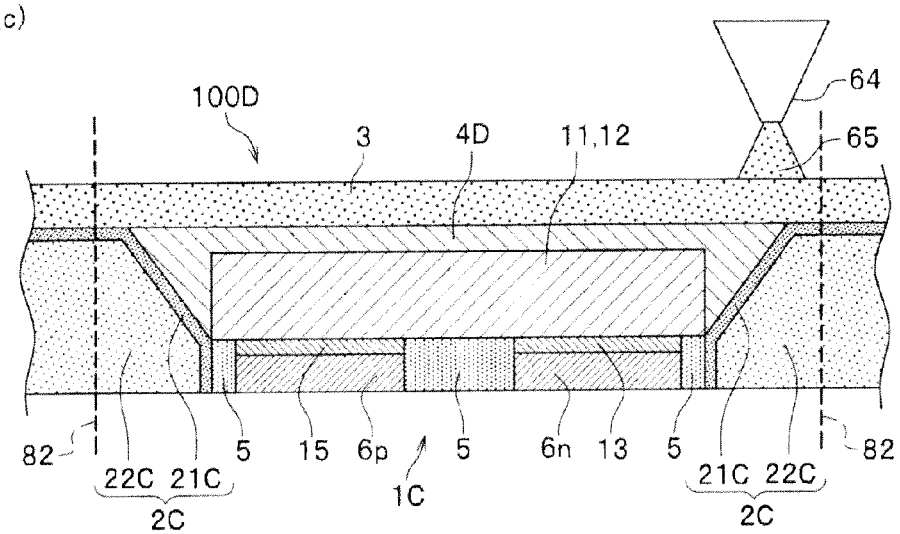

Then, in the wavelength conversion member forming step S408, a wavelength conversion member 3 is formed on the upper face of the light-transmissive member 4D, which is the light extraction face, as shown in FIG. 21(c). The wavelength conversion member 3 can be formed in the same manner as in the case of the wavelength conversion member forming step S308 in the fourth embodiment, and thus the detailed explanation will be omitted.

In FIG. 21(c), the light emitting element 1C after the sheet removing step S407 is oriented so the light-transmissive member 4D is shown at the top.

In the singulation step S409, the light emitting devices 100D are singulated by cutting the wavelength conversion member 3 and light reflective member 2C along the dividing lines 82 and the like, as in the case of the singulation step S309 in the fourth embodiment.

The light emitting device 100D shown in FIG. 19 is formed as described above.

<Variants>

In the light emitting device 100 shown in FIG. 1, the light reflective member 2 has a two-layer structure where the first layer 21 and second layer 22 are stacked, but it may constructed by stacking multiple sets of the first layer 21 and second layer 22 so they alternate. This can make a light reflective member 2 having even higher reflectance. Even in these cases, it is preferable to form the first layer 21 with a resin material having a higher refractive index than that of the resin material used in the second layer. This enables the utilization of interfacial reflection based on Snell's law, and can further increase the reflectance of the light reflective material 2.

Similarly in the light emitting devices 100A, 100B, 100C, and 100D in the other embodiments, the light reflective member 2, or the like, may be constructed by stacking multiple sets of the first layer 21, or the like, and the second layer 22, or the like, so they alternate.

The light emitting devices and the production method of the invention have been specifically explained based on several embodiments for realizing the invention in the foregoing. The present invention, however, is not limited to these disclosures, and must be broadly interpreted based on what is set forth in the scope of the claims section. It goes without saying that various modifications and variations made based on these disclosures are within the spirit and scope of the invention.

What is claimed is:

1. A light emitting device comprising:
  a semiconductor light emitting element; and
  a light reflective member having a multilayer structure and covering side faces of said semiconductor light emitting element,
  wherein said light reflective member includes:
    a first layer disposed in contact with side faces of the semiconductor light emitting element, the first layer comprising a light-transmissive resin containing a light reflective substance, and
    a second layer disposed in contact with an outer side of said first layer, the second layer comprising a light-transmissive resin containing the light reflective substance at a lower content than that of the first layer.

2. The light emitting device according to claim 1, wherein a thickness of said second layer is greater than a thickness of said first layer.

3. The light emitting device according to claim 1, wherein the semiconductor light emitting element is configured to emit visible light, and the light reflective substance comprises particles of $TiO_2$.

4. The light emitting device according to claim 1, wherein the semiconductor light emitting element is configured to emit ultraviolet light, and the light reflective substance comprises particles of $Al_2O_3$.

5. The light emitting device according to claim 1, wherein the resin forming said first layer has a higher refractive index against the light emitted by said semiconductor light emitting element than that of the resin forming said second layer.

6. The light emitting device according to claim 1, wherein a light reflective substance content of said first layer is 90 mass % or higher.

7. The light emitting device according to claim 5, wherein a thickness of said first layer is in a range of 10 μm to 30 μm.

8. The light emitting device according to claim 6, wherein a light reflective substance content of said second layer is 60 mass % or lower.

9. The light emitting device according to claim 1, wherein said light reflective member comprises a plurality of sets of alternative first and second layers.

10. The light emitting device according to claim 1, further comprising a wavelength conversion member that contains a wavelength conversion substance configured to convert light emitted by said semiconductor light emitting element into light having a different wavelength, the wavelength conversion member being provided on a light extraction face of said semiconductor light emitting element.

11. The light emitting device according to claim 1, further comprising a light-transmissive member that has light transmissive property, the light-transmissive member being disposed in contact with the side faces of said semiconductor light emitting element and having an outer face sloping outwardly towards the light extraction face with respect to a thickness of said semiconductor light emitting element, wherein said first layer is disposed to cover the outer face of said light-transmissive member.

12. A method of producing a light emitting device in which side faces of a semiconductor light emitting element are covered by a light reflective member having a multilayer structure, the method comprising:
  a semiconductor light emitting element mounting step comprising mounting said semiconductor light emitting element on a substrate,
  a first layer forming step comprising forming a first layer of said light reflective member so as to cover and contact an upper face and the side faces of said semiconductor light emitting element, the first layer comprising a light-transmissive resin containing a light reflective sub stance,
  a second layer forming step comprising forming a second layer of said light reflective member on said first layer, the second layer comprising a light-transmissive resin having a lower content of said light reflective substance than said first layer, and a light reflective member removing step comprising removing said first layer and said second layer from the upper face of said semiconductor light emitting element.

13. The method according to claim 12, further comprising a wavelength conversion member forming step following said light reflective member removing step, the wavelength conversion member forming step comprising forming a wavelength conversion member so as to cover the upper face of said semiconductor light emitting element, the wavelength conversion member containing a wavelength conversion substance configured to convert light emitted by said semiconductor light emitting element into light having a different wavelength.

14. The method according to claim 12, wherein a thickness of said second layer is greater than a thickness of said first layer.

15. The method according to claim 12, wherein the semiconductor light emitting element is configured to emit visible light, and the light reflective substance comprises particles of $TiO_2$.

16. The method according to claim 12, wherein the semiconductor light emitting element is configured to emit ultraviolet light, and the light reflective substance comprises particles of $Al_2O_3$.

17. The method according to claim 12, wherein, in said first layer forming step, said first layer is formed to have a content of said light reflective substance of at least 90 mass %.

18. The method according to claim 12, wherein, in said first layer forming step, said first layer is formed by pulsed spraying, said pulsed spraying comprising intermittently spraying a slurry containing said light-transmissive resin and particles of said light reflective substance.

19. The method according to claim 18, wherein, in said first layer forming step, said slurry contains a thermosetting resin, and said semiconductor light emitting element is heated at least to a temperature capable of causing said slurry to lose its fluidity.

20. A light emitting device comprising:
a semiconductor light emitting element; and
a light reflective member having a multilayer structure and covering side faces of said semiconductor light emitting element,
wherein said light reflective member includes:
a first layer disposed on an inner, semiconductor light emitting element side, the first layer comprising a light-transmissive resin containing a light reflective substance, and
a second layer disposed in contact with an outer side of said first layer, the second layer comprising a light-transmissive resin containing the light reflective substance at a lower content than that of the first layer, and
wherein the resin forming said first layer has a higher refractive index against the light emitted by said semiconductor light emitting element than that of the resin forming said second layer.

21. The light emitting device according to claim 20, wherein a thickness of said second layer is greater than a thickness of said first layer.

22. The light emitting device according to claim 20, wherein the semiconductor light emitting element is configured to emit visible light, and the light reflective substance comprises particles of $TiO_2$.

23. The light emitting device according to claim 20, wherein the semiconductor light emitting element is configured to emit ultraviolet light, and the light reflective substance comprises particles of $Al_2O_3$.

24. The light emitting device according to claim 20, wherein the resin forming said first layer has a higher refractive index against the light emitted by said semiconductor light emitting element than that of the resin forming said second layer.

25. The light emitting device according to claim 20, wherein a light reflective substance content of said first layer is 90 mass % or higher.

26. The light emitting device according to claim 20, wherein said light reflective member comprises a plurality of sets of alternative first and second layers.

27. The light emitting device according to claim 20, further comprising a wavelength conversion member that contains a wavelength conversion substance configured to convert light emitted by said semiconductor light emitting element into light having a different wavelength, the wavelength conversion member being provided on a light extraction face of said semiconductor light emitting element.

28. The light emitting device according to claim 20, further comprising a light-transmissive member that has light transmissive property, the light-transmissive member being disposed in contact with the side faces of said semiconductor light emitting element and having an outer face sloping outwardly towards the light extraction face with respect to a thickness of said semiconductor light emitting element, wherein said first layer is disposed to cover the outer face of said light-transmissive member.

* * * * *